United States Patent
Hirose et al.

(10) Patent No.: US 7,002,866 B2
(45) Date of Patent: Feb. 21, 2006

(54) SEMICONDUCTOR MEMORY DEVICE

(75) Inventors: Masanobu Hirose, Kyoto (JP); Masahisa Iida, Osaka (JP); Kiyoto Ohta, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/078,396

(22) Filed: Mar. 14, 2005

(65) Prior Publication Data

US 2005/0157527 A1 Jul. 21, 2005

Related U.S. Application Data

(63) Continuation of application No. 10/299,696, filed on Nov. 20, 2002, now Pat. No. 6,898,109.

(30) Foreign Application Priority Data

Nov. 20, 2001 (JP) ............................. 2001-354330

(51) Int. Cl.
*G11C 7/02* (2006.01)
(52) U.S. Cl. ...................... 365/207; 365/196
(58) Field of Classification Search ................ 365/207
See application file for complete search history.

(56) References Cited

U.S. PATENT DOCUMENTS

| | | | |
|---|---|---|---|
| 5,144,388 A | 9/1992 | Sawada et al. | |
| 5,222,038 A | 6/1993 | Tsuchida et al. | |
| 5,272,665 A | 12/1993 | Uesugi | |
| 5,828,594 A | 10/1998 | Fujii | |
| 5,917,745 A | 6/1999 | Fujii | |
| 5,973,953 A | 10/1999 | Yamashita et al. | |
| 6,384,445 B1 | 5/2002 | Hidaka et al. | |
| 6,476,646 B1 * | 11/2002 | Sim et al. | 365/207 |

FOREIGN PATENT DOCUMENTS

| | | |
|---|---|---|
| JP | 59-2365 | 1/1984 |
| JP | 63-244877 | 10/1988 |
| JP | 64-014954 | 1/1989 |
| JP | 05-151776 | 6/1993 |
| JP | 06-302778 | 10/1994 |
| JP | 07-045722 | 2/1995 |
| JP | 07-058215 | 3/1995 |
| JP | 08-097381 | 4/1996 |
| JP | 09-074172 | 3/1997 |
| JP | 11-097644 | 4/1999 |
| JP | 2001-118999 | 4/2001 |

* cited by examiner

*Primary Examiner*—Thong Q. Le
(74) *Attorney, Agent, or Firm*—McDermott Will & Emery LLP

(57) ABSTRACT

In a single intersection type (open bit line type) dynamic RAM, sub-arrays are disposed to the left and right sides of a sense amplifier column placed at the center. Each sub-array has a multiplicity of dynamic memory cells. In the subarrays located to the left and right of the sense amplifier column, bit lines in the same row constitute a complementary bit line pair. In each subarray, shielding wiring patterns that are formed parallel to, and in the same wiring layer of, these bit lines are disposed between the bit lines. All of these wiring patterns are set at a fixed potential, such as a power supply potential. Thus, interference noise between adjacent bit lines is effectively reduced.

2 Claims, 15 Drawing Sheets

PRIOR ART FIG. 12
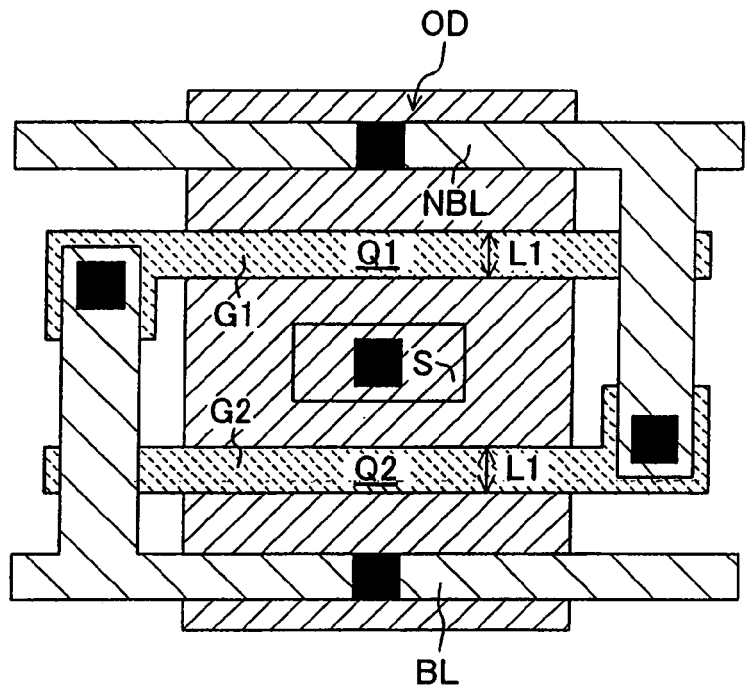
FIG. 13
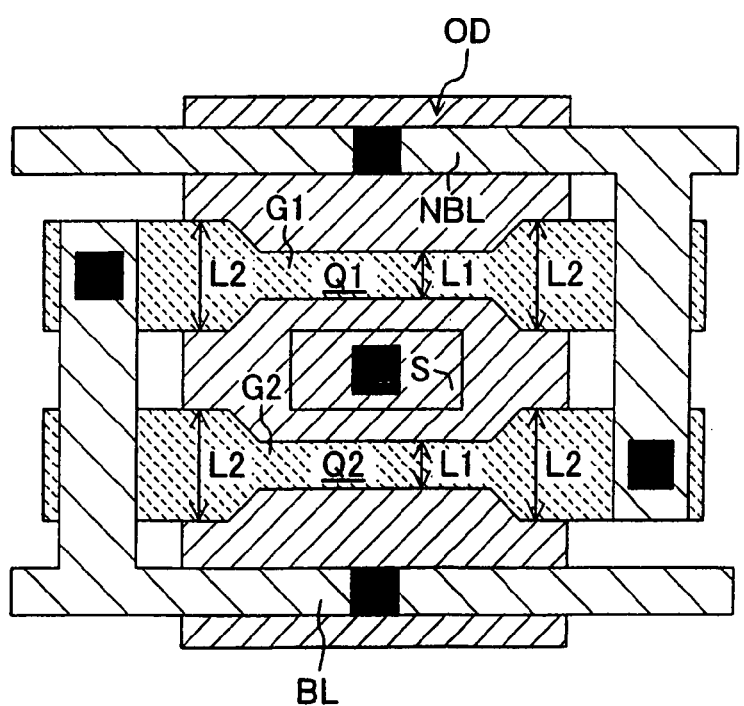

SEMICONDUCTOR MEMORY DEVICE

This application is a continuation of Application Ser. No. 10/299,696 filed Nov. 20, 2002, now U.S. Pat. No. 6,898,109.

BACKGROUND OF THE INVENTION

The present invention relates to semiconductor memory devices, such as random access memories, and more particularly to a single intersection type (open bit line type) semiconductor memory device in which bit lines connected to dynamic memory cells extends to the left and right of a sense amplifier column placed at the center.

Japanese Unexamined Patent Publication Nos. 59-2365 and 2001-118999 are examples of conventional semiconductor memory devices. The techniques disclosed in these publications pertain to a single intersection type (open bit line type) dynamic RAM that comprises dynamic memory cells each having a transistor and a capacitor, word lines, and bit lines, and that two bit lines constituting a complimentary bit line pair extend to the left and right of a sense amplifier column placed at the center.

The first one of the publications aims at avoiding that, in the case of using an information-storing capacitor utilizing a MOS capacitor, fluctuation of power supply voltage due to the operations of peripheral circuits is not transmitted to the entire two plate electrodes that are separately placed to the left and right of the sense amplifier column. For this purpose, first wiring line connected to respective plate electrodes at a plurality of locations are disposed along the direction perpendicular to bit lines, and the first wiring lines connected to respective plate electrodes are connected to each other by a second wiring line, the central portion of which is connected to a power supply line of a peripheral circuit by a third wiring line. With this configuration, the potentials of the plate electrodes are maintained uniform as a whole even when the potentials of peripheral circuits fluctuate.

On the other hand, the second one of the publications shows that, in cases where the information-storing capacitor is of COB (capacitor over bit line) type or one of the electrodes of the information storing capacitor has a cylindrical shape formed on the inner wall of a hole in the interlayer insulating film, common plate electrodes of the capacitors of a plurality of dynamic memory cells arranged to both the left and right sides of the sense amplifier column placed at the center are connected to each other, in order to reduce plate noise caused by parasitic capacitance between bit lines and the plate electrodes.

In recent years, commercialization of DRAM merged LSIs in which logic circuits and dynamic RAM are incorporated in a single chip has been actively sought. The memory capacity of the dynamic RAM that is incorporated in the DRAM merged LSI is relatively smaller than those of general-purpose DRAMs, and they are required to have a similar degree of transistor performance and cost reduction to standard CMOSs. In view of this, it is effective to incorporate a dynamic RAM using planar memory cells, which can be manufactured by a standard CMOS process. In addition, it is desired that the operational system be a single intersection type (open bit line type) to reduce the size of the dynamic RAM.

However, as the present inventors studied the noise interference in single intersection type dynamic RAMs, it has been found that interference noise between adjacent bit lines is dominant among the noise interference concerning recent microfabrication processes and that there is noise that is not negligible on the plate electrodes. To reduce the plate noise, it is insufficient to stabilize plate potentials using the techniques disclosed in the foregoing first and second publications. Moreover, no suggestions are made for the interference noise between adjacent bit lines. Furthermore, both techniques in the publications require an additional step of forming the plate electrodes in addition to the step of forming the gate electrodes of transistors, and therefore, they have drawbacks of many fabrication steps and increased wafer cost.

With reference to FIGS. 15 and 16, deterioration of operational margin of memory arrays caused by interference between adjacent bit lines is discussed below.

As shown in FIG. 15, in a single intersection type memory array in which memory arrays MATA and MATB are respectively disposed on the left and right of a sense amplifier column, parasitic capacitance exists between adjacent bit lines. As an example, the following describes a case where a word line WL0A of the memory array MATA is selected to read out data from memory cells MC and a high level is read out from a bit line BL1 whereas a low level is read out from other bit lines BL0 and BL2 to BLn.

In this case, since the data of the bit lines BL0 and BL2 that are adjacent to the bit line BL1 are inverted data, the bit line BL1 receives coupling noise via parasitic capacitances Cbs01A and Cbs12A between the adjacent bit lines, and as a result, the read potential that appears in this bit line BL1 is small. One the other hand, the potentials of bit lines NBL0 to NBLn that are at the memory array MATB side, which are reference potentials, do not fluctuate. Accordingly, concerning the potential difference between the complementary bit line pair at the time when amplifying operation is started by the sense amplifier, the read potential difference in the complementary bit line pair (BL1, NBL1) is smaller than those of other complementary bit line pairs. When amplifying operation is performed by the sense amplifier under this state, it is often the case that data are erroneously amplified if the sense amplifier is off-balance because the read margin for the high level is small in the bit line BL1.

In addition, when an amplifying operation is performed under the state in which the high level signal of the bit line BL1 is small and the low level signals of the other bit lines BL0 and BL2 to BLn are large, the amplifying speed of the bit lines BL0 and BL2 to BLn is fast but the amplifying speed of the bit line BL1 is slow. In this case as well, negative phase noise occurs in the bit line BL1 via the parasitic capacitances Cbs01A and Cbs12A between the bit lines, and negative phase noise occurs also in the bit line NBL1 at the memory array MATB side via parasitic capacitances Cbs01B and Cbs12B. Because these noises further delay the amplifying speed of the complementary bit line pair (BL1, NBL1), the data of the complementary bit line pair (BL1, NBL1) are inverted, resulting in a read error.

Thus, in single intersection type memory arrays, there is a possibility of read errors depending on data patterns read out to the bit lines because parasitic capacitance exists between adjacent bit lines. In particular, when the amount of signal charge stored in a memory cell reduces due to leak current or the like, the signal level read out to the bit line further reduces, further increasing the possibility of read errors.

Further, conventional dynamic RAMs have the following drawbacks. If they have large sense amplifier circuits, the degree of integration is small. In addition, if they have large operational variations between N-channel and P-channel pair transistors constituting the sense amplifier circuits, their operations are not stable and there is a possibility of data read errors.

SUMMARY OF THE INVENTION

It is an object of the present invention to provide a single intersection type semiconductor memory device in which operation margins are improved by suppressing interference noise between bit lines and plate noise.

It is another object of the present invention to improve layout configurations around the sense amplifier circuits in dynamic RAMs using planer memory cells to realize a high degree of integration and stable operations.

In order to accomplish the foregoing object, in the present invention, shielding wires are disposed between bit lines and/or plate electrodes in dynamic memory cells are commonized as far as possible.

In order to accomplish the other object, in the present invention, bit lines are formed in different wiring layers between the memory mats and the sense amplifier column, or a special configuration is used to form the gate electrodes of the pair transistors constituting the sense amplifier circuit.

More specifically, the present invention provides a semiconductor memory device comprising: a plurality of word lines; a plurality of bit lines extending in a direction intersecting the word lines; a plurality of dynamic memory cells each disposed at an intersection of the word lines and the bit lines and having a transfer gate and a capacitor, the transfer gate composed of a MOS transistor, one end of the transfer gate in the dynamic memory cell being connected to one of the bit lines, the other end being connected to a storage node of the capacitor and a gate of the MOS transistor being connected to one of the word lines; and a first wiring pattern for shielding disposed in each space between adjacent bit lines of the plurality of bit lines, the first wiring pattern extending parallel to the adjacent bit lines and formed in the same wiring layer as that of the adjacent bit lines.

Thus, the first wiring pattern for shielding disposed between adjacent bit lines greatly reduces interference noise between the adjacent bit lines, and consequently, the present invention achieves more stable data read operation.

The present invention also provides a semiconductor memory device comprising: a plurality of word lines; a plurality of bit lines extending in a direction intersecting the word lines; and the dynamic memory cells disposed at each intersectional point of the word lines and the bit lines; each of the dynamic memory cells having a transfer gate composed of a MOS transistor and a capacitor having a storage node and a plate electrode, one end of the transfer gate being connected to the bit line and the other end being connected to the storage node of the capacitor, the gate of the transfer gate being connected to the word line, wherein: the word lines and the plate electrodes of the dynamic memory cells are formed in the same manufacturing step; and a plate electrode is composed of the plate electrodes of a plurality of dynamic memory cells including dynamic memory cells connected to a common word line and of other dynamic memory cells, whose capacitors are disposed adjacent to the capacitors of the dynamic memory cells connected to the common word line.

Thus, in the present invention, the plate electrode in the plurality of dynamic memory cells comprised in the memory array is segmented due to the presence of the word lines, but the plate electrode is shared between many memory cells, including memory cells connected to a common word line and memory cells whose capacitors are adjacent to each other, to form a common plate electrode. Therefore, the resistance of the plate electrode is reduced, and stable operation can be obtained against interference noise in the plate electrodes.

The present invention further provides a semiconductor memory device comprising: at least one memory subarray including: a plurality of word lines; a plurality of bit lines extending in a direction intersecting the word lines; a plurality of plate electrodes; and dynamic memory cells each disposed at an intersectional point of the word lines and the bit lines; each of the dynamic memory cells having a transfer gate composed of a MOS transistor and a capacitor having a storage node and coupled to one of the plate electrodes, one end of the transfer gate being connected to the bit line and the other end being connected to the storage node of the capacitor, a gate of the transfer gate being connected to the word line, wherein: each of the plate electrodes is disposed between the word lines so as to extend parallel to the word lines; plate electrode strapping lines extending parallel to the plate electrodes are disposed in a wiring layer that is an upper layer of the plate electrodes; and the plate electrodes and the plate electrode strapping lines are commonly connected respectively at a plurality of positions in the same memory subarray.

In particular, in the present invention, it is preferable that the plate electrode strapping lines and the plate electrodes are electrically connected in a region located between a plurality of memory mats.

Accordingly, in the present invention, the plate electrode is connected to the plate electrode strapping line disposed in the wiring layer above the plate electrodes at a plurality of locations, and therefore, the resistance of the plate electrode can be reduced. Therefore, interference noise is suppressed while data are being read from the plate electrodes. Moreover, the plate electrodes are disposed between the word lines so as to extend parallel to the word lines, and thus, the plate electrodes and the word lines can be formed in the same manufacturing step.

In addition, the present invention provides an open bit line type semiconductor memory device comprising: at least a first and a second memory mats each comprising a plurality of word lines, a plurality of bit lines, dynamic memory cells each disposed at an intersectional point of the word lines and the bit lines, the dynamic memory cells each including a transfer gate composed of a MOS transistor and a capacitor having a storage node and a plate electrode; wherein the first and the second memory mats are disposed along the direction of the bit lines, and the bit line of the first memory mat and the bit line of the second memory mat constitute a complementary bit line pair, the semiconductor memory device including: a plurality of global bit lines disposed in common with the memory mats and extending in the direction of the bit lines; and plate electrode potential-supplying lines each connecting the plate electrodes of the dynamic memory cells in the first and the second memory mats commonly between the first and the second memory mats, and each formed between predetermined two global bit lines of the plurality of global bit lines and in the same wiring layer of the global bit lines.

Accordingly, in the present invention, the plate electrodes of two memory mats positioned to the left and right of the sense amplifier column are connected to each other by the plate potential-supplying line. Therefore, noise occurring in the plate electrodes during operation becomes uniform between the two memory mats, and plate noise is reduced.

Further, the present invention provides a semiconductor memory device comprising: a plurality of word lines; a plurality of bit lines extending in a direction intersecting the word lines; and a plurality of dynamic memory cells each disposed at an intersection of the word lines and the bit lines and having a transfer gate and a capacitor, the transfer gate composed of a MOS transistor, wherein: each of the dynamic memory cells is configured such that: the capacitor is composed of a MOS transistor; the transfer gate is arranged at a position shifted toward the word line; an active region of the capacitor has an expanded portion in which a portion opposite the position of the transfer gate expands toward the bit line; and the bit line has a protruding portion extending toward the transfer gate.

With this configuration, the present invention makes it possible to increase the area of the MOS capacitor of the dynamic memory cell as wide as possible within a limited area.

The present invention also provides an open bit line type semiconductor memory device comprising: at least a first and a second memory mats each comprising a plurality of word lines, a plurality of bit lines, dynamic memory cells each disposed at an intersectional point of the word lines and the bit lines, the dynamic memory cells each including a transfer gate composed of a MOS transistor and a capacitor having a storage node and a plate electrode; and a sense amplifier column disposed between the first and the second memory mats and amplifying potential differences between pairs of complementary bit lines composed of the bit lines in the first memory mat and the bit lines in the second memory mat; wherein: portions of the bit lines in the first and the second memory mats are formed in a predetermined layer of wiring layers; and portions of the bit lines extending in the sense amplifier column are formed in a wiring layer that is different from the predetermined layer of wiring layers.

Accordingly, in the present invention, two bit lines constituting a complementary bit line pair are parallel to each other, and the wiring interval is uniform with respect to the sense amplifier column direction. Therefore, the layout design of the sense amplifier is facilitated and the chip area is reduced.

The present invention also provides an open bit line type semiconductor memory device comprising: at least a first and a second memory mats each comprising a plurality of word lines, a plurality of bit lines, dynamic memory cells each disposed at an intersectional point of the word lines and the bit lines, the dynamic memory cells each including a transfer gate composed of a MOS transistor and a capacitor having a storage node and a plate electrode; and a sense amplifier column disposed between the first and the second memory mats and amplifying potential differences between pairs of complementary bit lines composed of the bit lines in the first memory mat and the bit lines in the second memory mat, wherein: the plurality of bit lines are formed in a wiring layer above the capacitor and the plurality of word lines; and two sets of sense amplifier circuits corresponding to two adjacent sets of complementary bit line pairs are arrayed for the pitch of the two adjacent sets of complementary bit line pairs along the bit line direction.

In particular, it is preferable that in two sets of sense amplifier circuits corresponding to two sets of complementary bit line pairs, N-channel pair transistors constituting both sense amplifier circuits are disposed adjacent to each other and P-channel pair transistors constituting both sense amplifier circuits are also disposed adjacent to each other.

Thus, in the present invention, two sets of sense amplifier circuits corresponding to two sets of complementary bit line pairs are arrayed along the bit line direction, and therefore, the layout dimension is reduced with respect to the sense amplifier direction (word line direction). In particular, with this configuration, the N-channel pair transistors that constitute two sets of sense amplifier circuits are disposed adjacent to each other, and the P-channel pair transistors that constitute two sets of sense amplifier circuits are also disposed adjacent to each other. Therefore, the regions for separating the N-channel pair transistors and the P-channel pair transistors are reduced and the layout dimension is reduced also with respect to the bit line direction.

The present invention also provides a semiconductor memory device comprising a sense amplifier circuit amplifying a voltage difference between a pair of complementary bit lines, wherein: two gate electrodes of P-channel or N-channel pair transistors constituting the sense amplifier circuit are formed parallel to each other in the same active region; and the gate length of the two gate electrodes is set to be longer in opposing end portions of the active region than in a central portion thereof.

Thus, according to the present invention, the channel region in the vicinity of the boundary between the active region and the separating region does not easily function as a transistor in the vicinity of the threshold voltage; therefore, relative variation between the pair transistors is reduced and operation stability of the sense amplifier circuit is increased.

BRIEF DESCRIPTION OF THE DRAWINGS

FIG. 12 shows the conventional layout configuration of pair transistors that constitute a sense amplifier circuit in a dynamic RAM;

FIG. 13 shows the layout configuration of pair transistors that constitute a sense amplifier circuit in a dynamic RAM according to Embodiment 3 of the present invention;

DETAILED DESCRIPTION OF THE INVENTION

Hereinbelow, preferred embodiments of the present invention are described with reference to the appended drawings.

Embodiment 1

Figure 14:
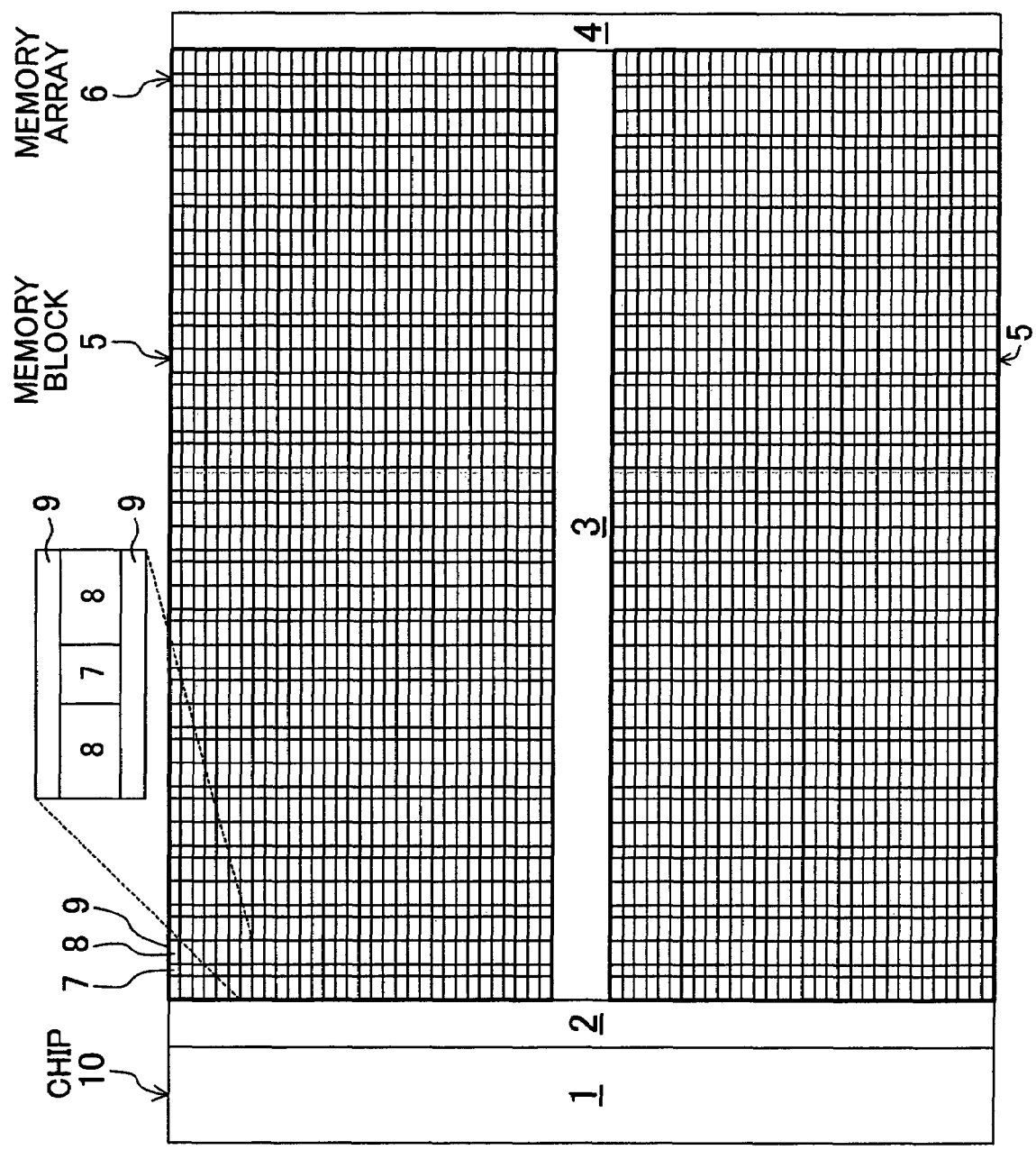
FIG. 14 shows the configuration of the whole chip of a dynamic RAM according to Embodiment 1 of the present invention.
Figure 15:
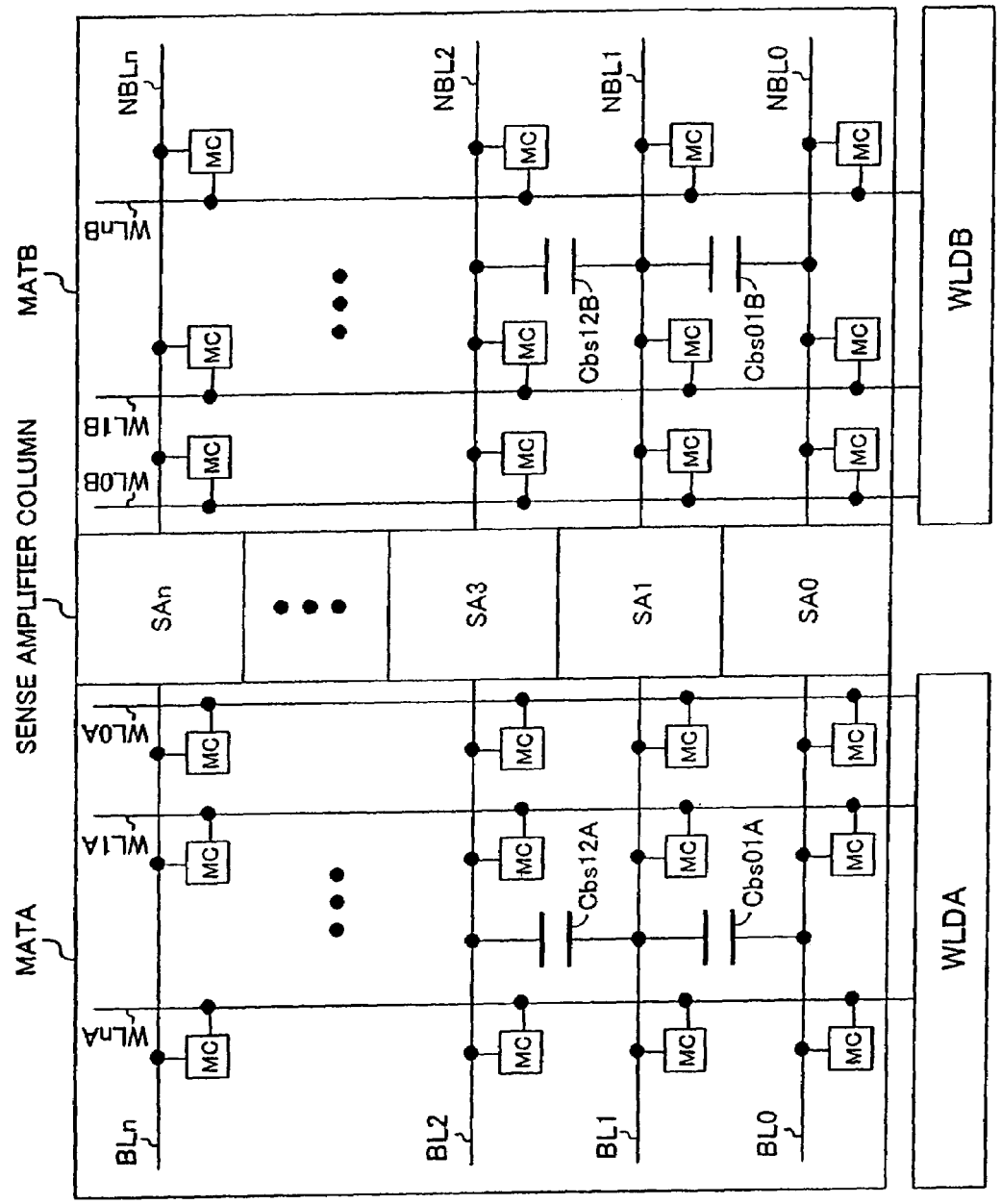
FIG. 15 shows a schematic configuration of a conventional dynamic RAM.
Figure 16:
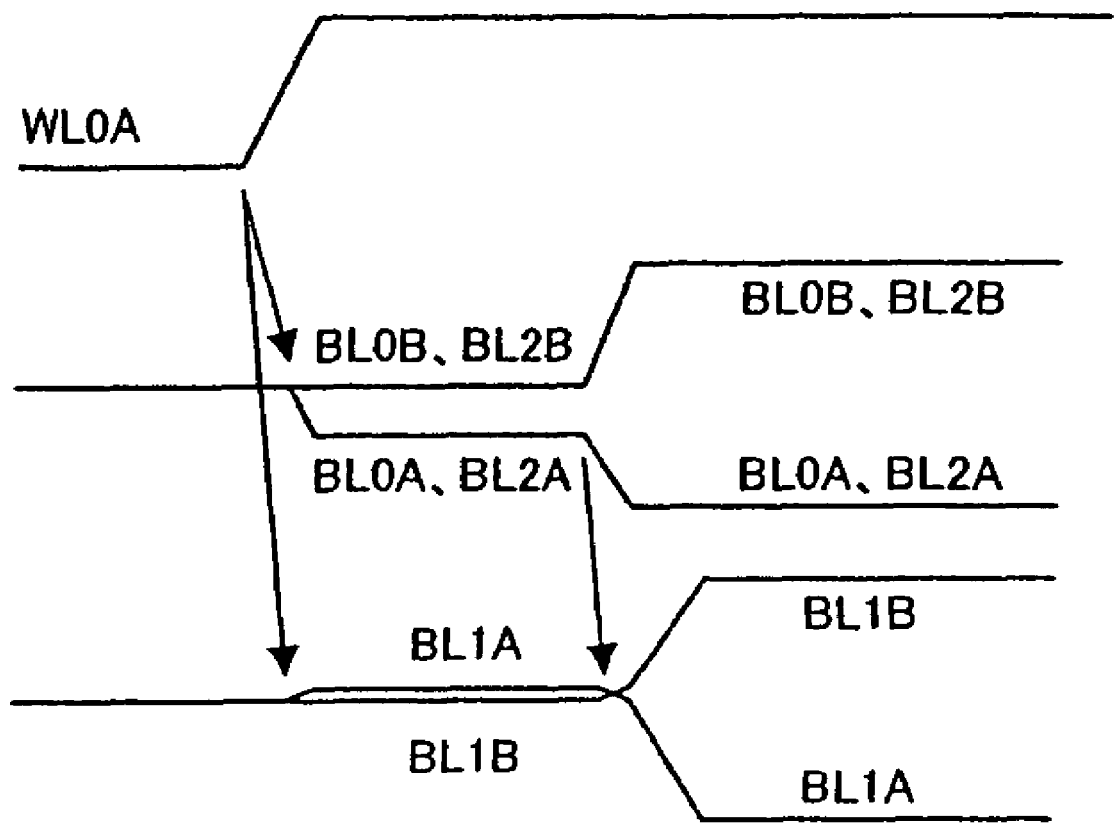
FIG. 16 illustrates an erroneous reading operation resulting from noise in a conventional dynamic RAM.

FIG. 14 schematically shows the whole layout of a semiconductor memory device according to Embodiment 1 of the present invention.

The figure shows a memory chip 10 that constitutes a dynamic RAM. In this memory chip 10, reference numerals 1 represents a memory control circuit block disposed on the left end in the figure, numeral 2 represents a read and write amplifier and a column-selecting circuit block disposed on the right of the memory control circuit block in the figure, numeral 3 represents a row decoder and word line-driving circuit block disposed in the center and along the longitudinal direction of the memory chip 10, numeral 4 represents an internal power-generating circuit block disposed on the right end in the figure, and numeral 5 represents two memory blocks separately disposed above and below the row decoder and word line-driving circuit block 3.

The memory block 5 has memory arrays 6 that are disposed so that each row along the longitudinal direction of the memory chip 10 has 16 memory arrays. The memory array 6 has, as shown in the enlarged view, memory cell arrays 8 (hereafter referred to as subarrays) disposed to form two columns along the shorter length direction of the memory chip 10, a sense amplifier column 7 disposed between two subarrays 8, 8 that are in the same row, and a word line strapping region 9 provided between subarrays 8, 8 that are above and below the word line strapping region. Each sense amplifier circuit that constitutes the sense amplifier column 7 comprises a CMOS latch circuit. A dynamic RAM according to the present embodiment has a so-called one-crosspoint (open bit line) configuration, in which a complementary bit line pair is formed by a bit line extending on the left of the sense amplifier column 7 and a bit line extending on the right of the sense amplifier column 7.

Each memory block 5 has a plurality of global bit lines (not shown in the figure) extending through the memory arrays 6 formed thereon, and the global bit lines are selectively connected to the bit lines in each memory array 6 by switching means (not shown in the figure) in each memory array 6. The read and write amplifier and column-selecting circuit block 2 includes, though not shown in the figure, a column-selecting circuit for selecting the global bit lines, a read amplifier circuit for amplifying a global bit line pair selected by the column-selecting circuit, and write amplifier circuit for writing data to the global bit line pair. The internal power-generating circuit block 4 includes, though not shown in the figure, a step-down circuit, a plate-potential-generating circuit, and a bit line precharge potential-generating circuit.

One of the subarrays 8, which is shown in the enlarge view, has, for example, 32 word lines, 1 redundant word line, and 32 bit lines that extend in the direction that crosses the word lines and the redundant word line, and at each intersectional point of the word lines and the bit lines, a dynamic memory cell of one-transistor and one-capacitor configuration is connected. One sub array 8 has 32 word lines and 32 bit lines provided therein, and thus the number of memory cells is 32×32=1024. Each memory array 6 is provided with 64 subarrays 8, and 16 memory arrays 6 are provided along a bit line direction. Thus, the memory capacity is 1024×64×16=1M. Two memory blocks 5 are provided in the upper portion and the lower portion, and thus, the whole memory capacity is 1M×2=2M bits.

Figure 1B:
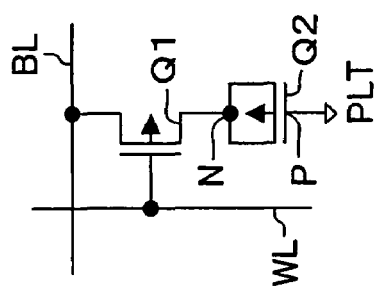
FIG. 1B shows the configuration of a memory cell.
Figure 1A:
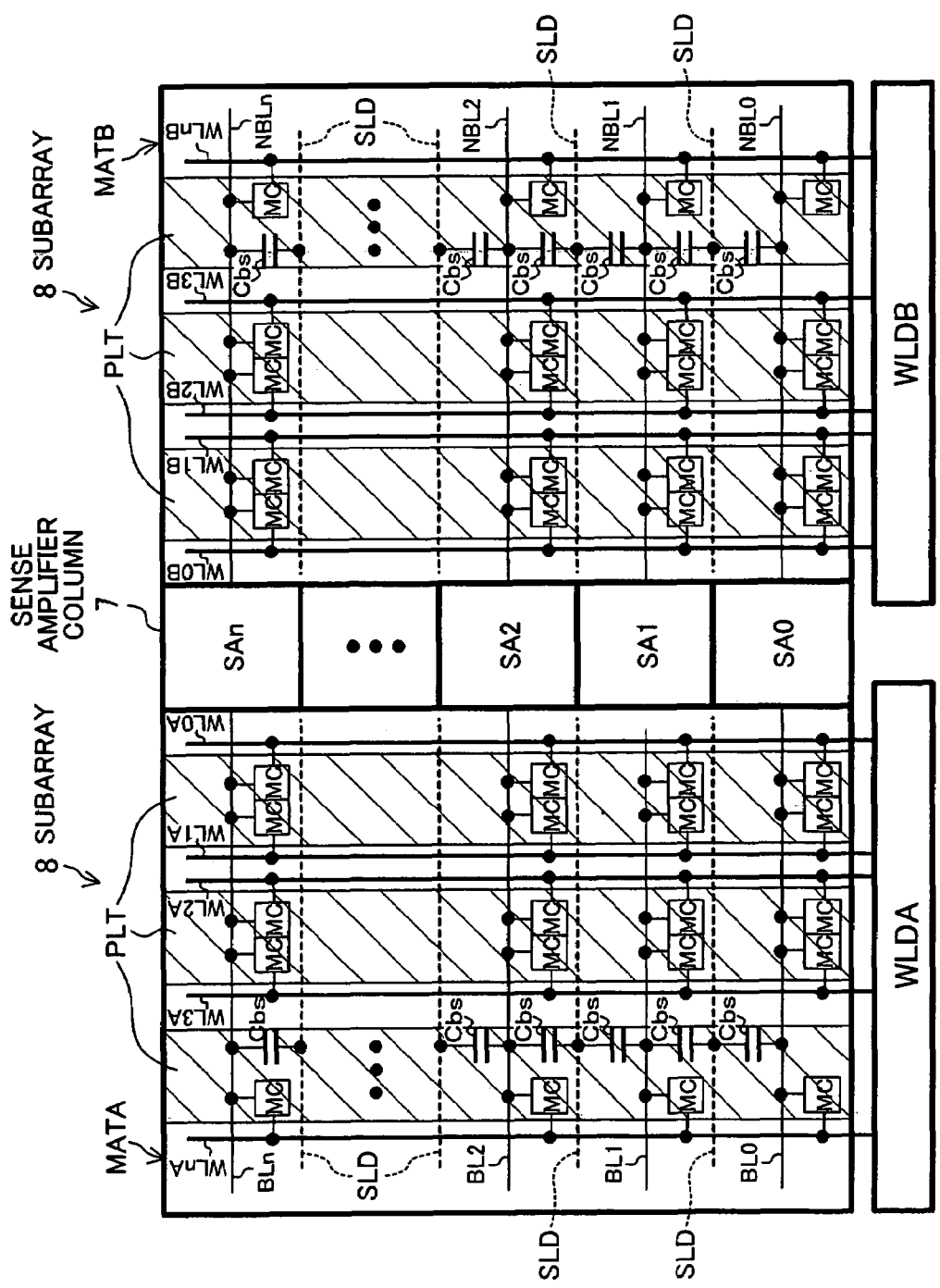
FIG. 1A schematically shows the configuration of a dynamic RAM of Embodiment 1 according to the present invention.

FIG. 1A shows the specific configuration of two subarrays 8 and the sense amplifier column 7 arranged therebetween, which are shown in the enlarged view of FIG. 14.

In FIG. 1A, MATA denotes a subarray located on the left of the sense amplifier column 7, MATB denotes a subarray located on the right of the sense amplifier column 7, WL0A to WLnA and WL0B to WLnB denote word lines, and BL0 to BLn and NBL0 to NBLn denote bit lines, which constitute complementary bit lines by a pair of bit lines in the same row, (BL0, NBL0) to (BLn, NBLn). MC denotes dynamic memory cells each comprising a transistor and a capacitor, and SA0 to SAn denote sense amplifier circuits including CMOS latch circuits. PLT denotes common plate electrodes of the capacitors in the memory cells MC, which is shared between a plurality of memory cells MC including a plurality of memory cells MC connected to a word line (for example, WL0A) and a plurality of adjacent memory cells MC whose capacitors are adjacent to the capacitors of the foregoing plurality of memory cells MC, (a plurality of the memory cells MC that are connected to the word line WL1A in the example of FIG. 1A). WLDA and WLDB denote word line-driving circuits. The sense amplifier column 7 has a plurality of sense amplifier circuits SA0 to SAn.

Also in FIG. 1A, SLD denotes a first wiring pattern having a multiplicity of wiring lines disposed between adjacent bit lines BL0 to BLn and between adjacent bit lines NBL0 to NBLn separately for each of the subarrays MATA and MATB. To the first wiring pattern SLD, a voltage potential VDD that is a fixed potential is supplied. The bit lines BL0 to BLn and NBL0 to NBLn are formed in a first metal wiring layer, and the first wiring pattern SLD is also formed in the first wiring layer, which is the same wiring layer in which the bit lines BL0 to BLn and NBL0 to NBLn are formed. CBs denotes a parasitic capacitance between the first wiring pattern SLD and the bit lines BL0 to BLn and NBL0 to NBLn.

In the present embodiment, the first wiring pattern SLD formed in the same wiring layer in which the bit lines are formed is provided between adjacent bit lines BL0 to BLn in the subarray MATA and between adjacent bit lines NBL0 to NBLn in the subarray MATB as described above, and the potential of the first wiring pattern SLD is set at a fixed potential VDD. As a consequence, the first wiring pattern SLD serves as a shielding line when stored information is read out from memory cells MC to a complementary bit line pair, or when a very small potential difference that is read out into a bit line is amplified by a corresponding sense amplifier SA0 to SAn. Therefore, interference noise to data read caused via a parasitic capacitance between adjacent bit lines can be greatly reduced, and the data read operation can be stabilized.

FIG. 1B shows a circuit diagram of a memory cell MC. In FIG. 1B, Q1 denotes a transfer gate comprising a P-channel MOS transistor and Q2 denotes a capacitor likewise comprising a P-channel MOS transistor; they constitute a parallel plate type memory cell. Although FIG. 1B shows the transfer gate Q1 and the capacitor Q2 comprising P-channel MOS transistors, it is also possible to form these elements Q1 and Q2 using N-channel MOS transistors. WL denotes a word line and BL denotes a bit line. The word line WL is connected to the gate of the transfer gate Q1, the bit line BL is connected to one of the source and the drain of the transfer gate Q1, the other one of the source and the drain of the transfer gate Q1 is connected to a storage node N of the MOS capacitor Q2, and a plate electrode P of the MOS capacitor Q2 is connected to the shared common plate electrode PLT.

Figure 2:
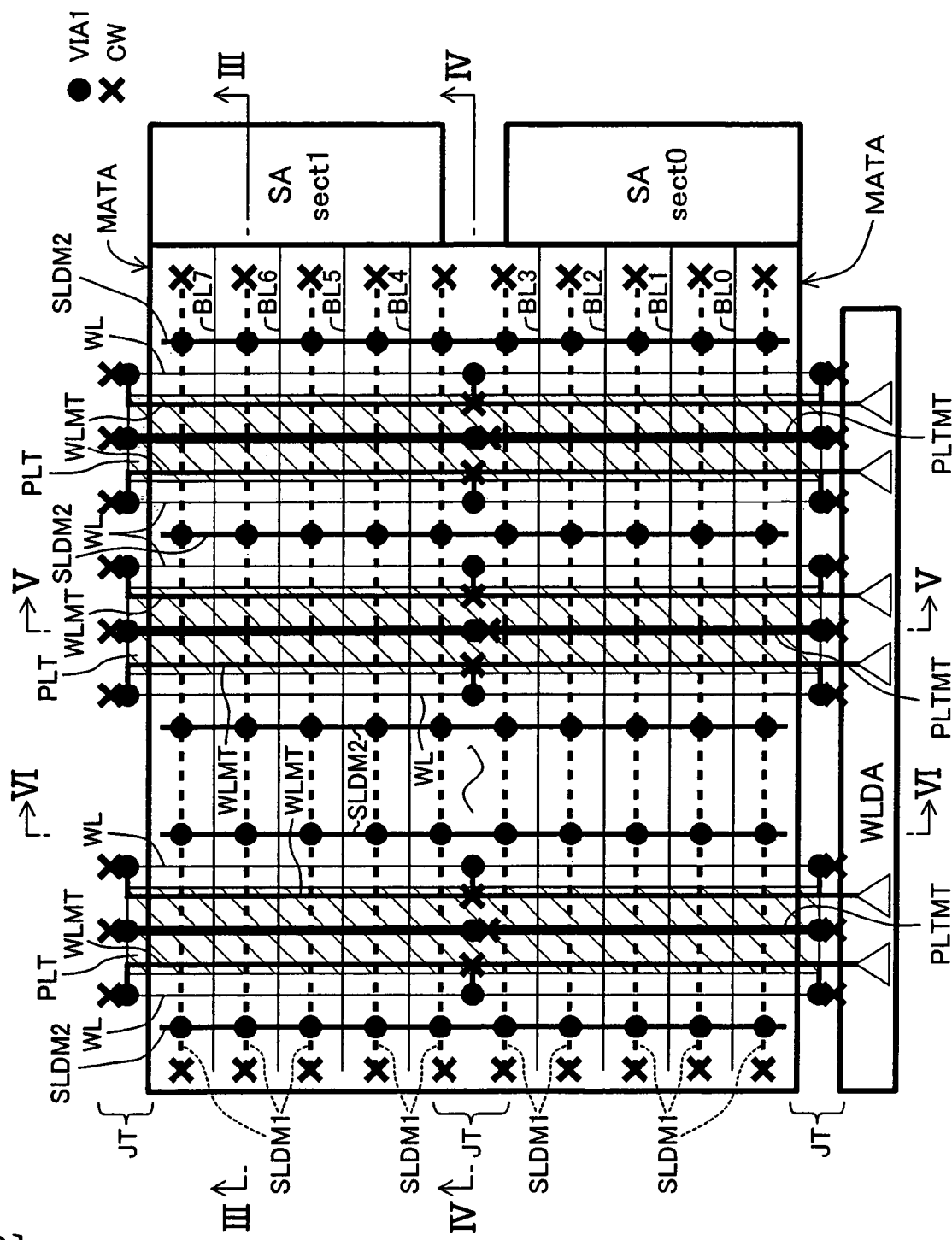
FIG. 2 is shows the configuration of a subarray of the dynamic RAM in detail.

FIG. 2 shows a more detailed configuration of two subarrays MATA arranged vertically and a word line strapping region 9 located between the two subarrays. In the subarrays MATA, BL0 to BL7 denote bit lines formed in a first metal wiring layer, SASect0 and SAsect1 denote a sense amplifier column, WL denotes word lines formed of polysilicon, WLMT denotes a word line strapping line formed in a second metal wiring layer, and PLT denotes a common plate electrode that is formed of a polysilicon wiring line and is a plate electrode shared between a plurality of memory cells MC commonly connected to a word line WL and another plurality of memory cells MC adjacent to the foregoing plurality of memory cells MC.

In addition, PLTMT denotes a plate electrode strapping line formed in a second metal wiring layer, SLDM1 denotes the first wiring pattern formed in the first metal wiring layer and is positioned between adjacent bit lines BL0 to BL7. SLDM2 denotes a second wiring pattern formed in the second metal wiring layer. It is arranged intersecting the first wiring pattern SLDM1 and along the direction in which the word lines WL extend, and is commonly connected to the first wiring pattern SLDM1 by contacts VIA1 (which are denoted by black circles in the figure) at their intersectional points. A power supply potential VDD that is a fixed potential is supplied to the second wiring pattern SLDM2, and the power supply potential VDD is then supplied to the first wiring pattern SLDM1 via the second wiring pattern SLDM2. JT denotes a word line strapping region, which is a region for connecting the word lines WL with the word line strapping lines WLMT and for connecting the common plate electrode PLT and the plate electrode strapping line PLTMT. VIA1, which is represented by black circles in the figure, denotes a contact for connecting the metal wiring that is in the first layer with the metal wiring that is in the second layer, and CW, which is represented by X in the figure, denotes a contact for connecting the wiring that is in the first layer with the polysilicon and the active region.

In the present embodiment, the first wiring pattern SLDM1 is formed in parallel to, and by the same wiring layer of, the bit lines BL0 to BL7, and it is connected to the substrate of the subarray MATA by the contacts CW at the left and the right end portions of the subarray MATA. The second wiring pattern SLDM2 is in the same wiring layer as that of the word line strapping lines WLMT and is arranged parallel to these word line strapping lines WLMT.

Figure 3:
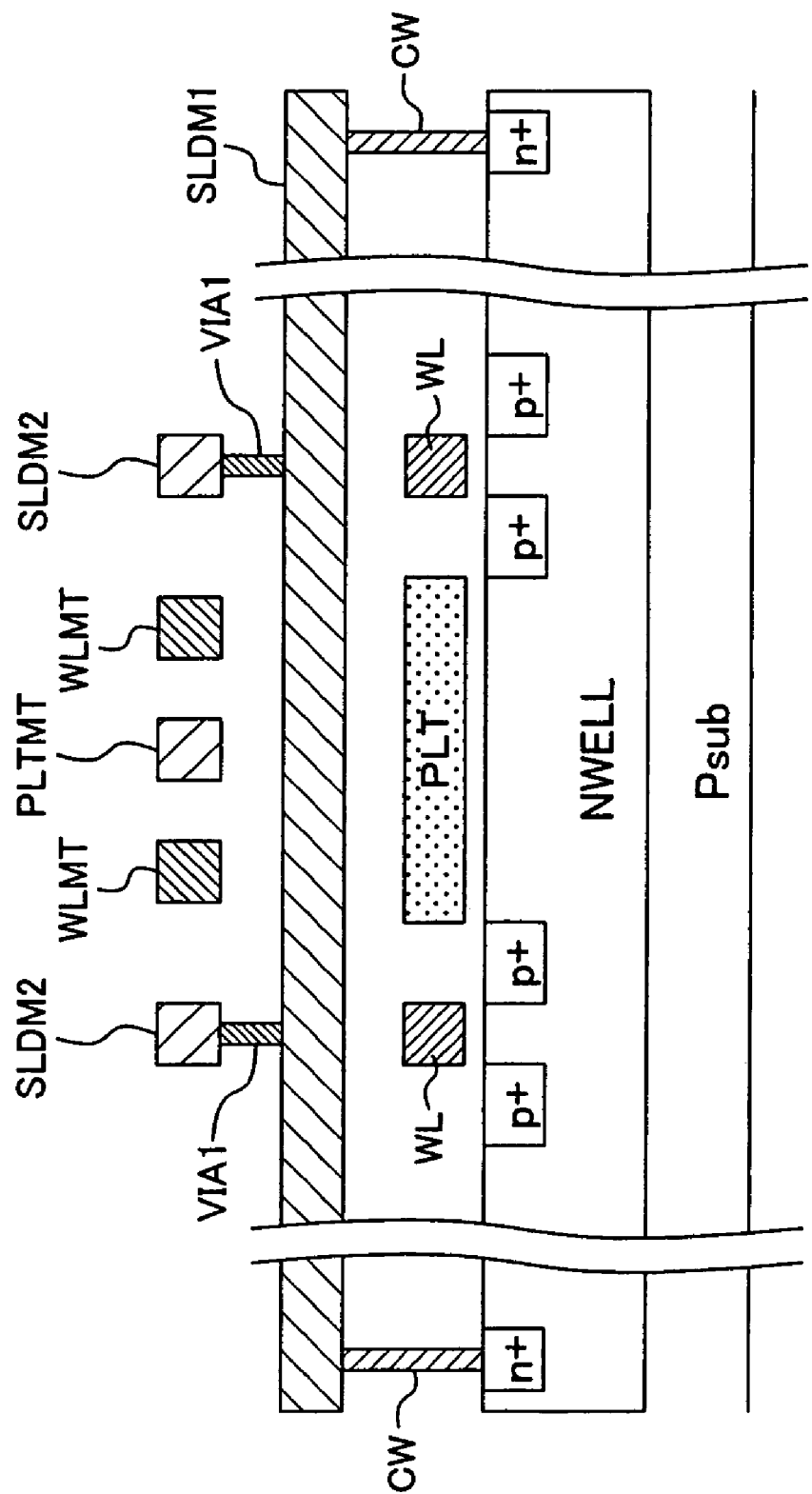
FIG. 3 is a cross-sectional view taken along the line III—III of FIG. 2.
Figure 4:
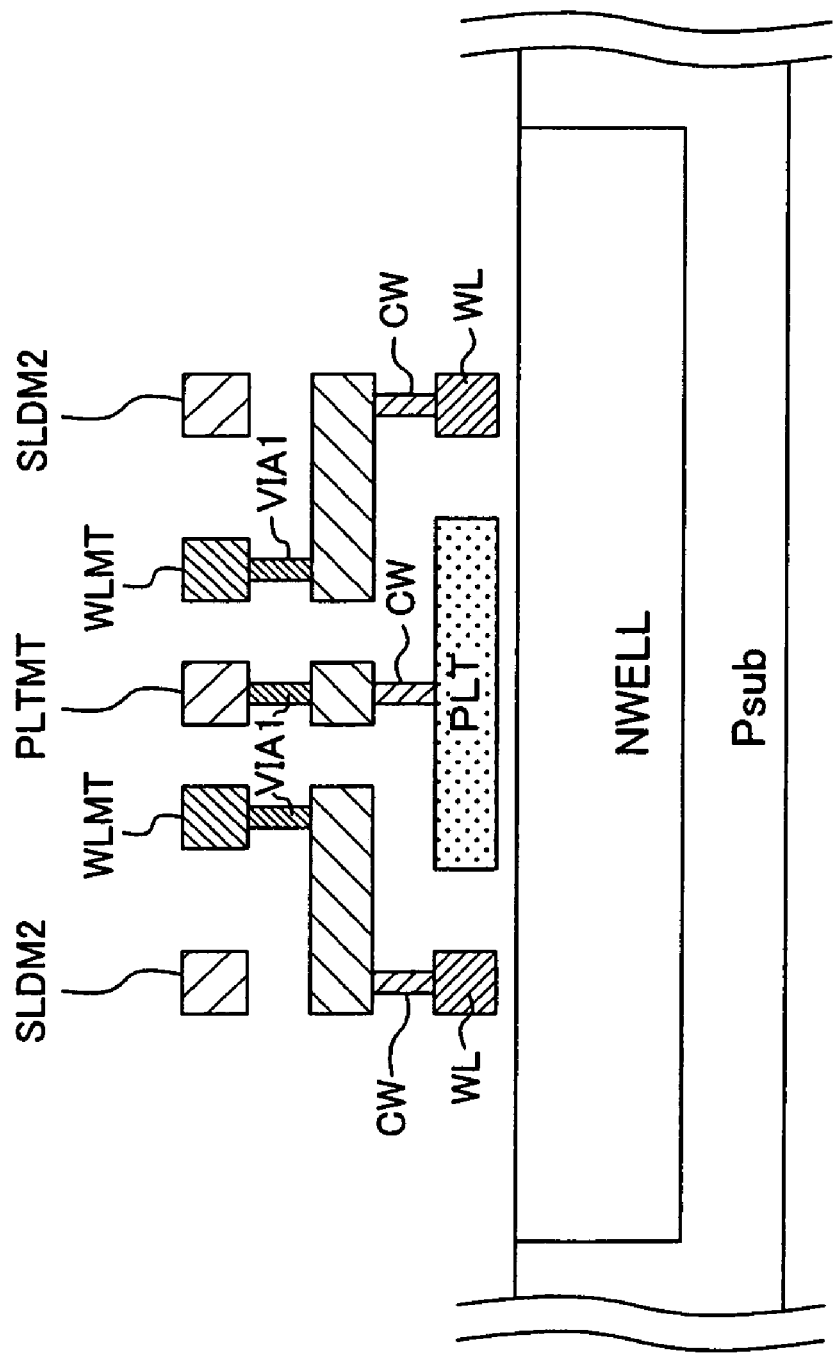
FIG. 4 is a cross-sectional view taken along the line IV—IV of FIG. 2.

FIG. 3 is a cross-sectional view of the subarray MATA taken along line III—III of FIG. 2, and FIG. 4 is a cross-sectional view taken along line IV—IV in the word line strapping region JT. Referring to FIG. 3, the common plate electrodes PLT shared by a plurality of memory cells MC is formed so that it is located between two adjacent word lines WL and extends parallel to these word lines WL, and it is formed in the polysilicon layer that is in the first layer by the same manufacturing step as that for the word lines WL. The first wiring pattern SLDM1 is connected to the second wiring pattern SLDM2 at each intersectional point therewith by the contacts VIA1 for connecting the metal wiring of the first layer with the metal wiring of the second layer, and it also supplies a fixed potential VDD to a substrate NWELL via contacts CW for connecting the first wiring pattern SLDM1 with active regions n+ at the left and the right end portions. Over the first wiring pattern SLDM1, a second wiring layer is formed, and in this wiring layer, a plate electrode strapping line (fourth wiring pattern) PLTMT is formed at the position located above the common plate electrode PLT in a subarray 8. In the second wiring layer, word line strapping lines WLMT are formed so that they sandwich the plate electrode strapping line PLTMT and extends adjacent to and parallel to the plate electrode strapping line PLTMT, and the second wiring pattern SLDM2 is formed adjoining further to the left and right of the word line strapping lines (row selecting signal lines) WLMT. Thus, as is apparent from FIG. 3, the plate electrode strapping line (fourth wiring pattern) PLTMT is located between two word line strapping lines WLMT that are located to the left and right thereof.

Accordingly, as can be seen from FIG. 2, around given four word line strapping lines WLMT, a plate electrode strapping line (the fourth wiring pattern) PLTMT is disposed between two of the word line strapping lines (row-selecting signal line) WLMT, WLMT that are on the left, a second wiring pattern SLDM2 is disposed between two of the word line strapping lines (row-selecting signal line) WLMT, WLMT that are at the center, and another plate electrode strapping line PLTMT is disposed between two of the word line strapping lines (row-selecting signal line) WLMT, WLMT that are on the right. That is, a second wiring pattern SLDM2 and a plate electrode strapping line PLTMT are alternately disposed between each two adjacent word line strapping lines WLMT, WLMT. In other words, one second wiring pattern SLDM2 is disposed between every two adjacent word line strapping lines WLMT and one plate electrode strapping line PLTMT is disposed every two adjacent word line strapping line WLMT.

Referring to FIG. 4, in the word line strapping region JT, the plate electrode strapping line PLTMT is connected to the common plate electrode PLT that is disposed directly below, via the contact VIA1 and the contact CW. The word line strapping line WLMT first enters the first wiring layer via the contact VIA1, then bends to the left or the right so as to avoid both side ends of the common plate electrode PLT, and is connected to the word line WL in the polysilicon layer via the contact CW.

Figure 5:
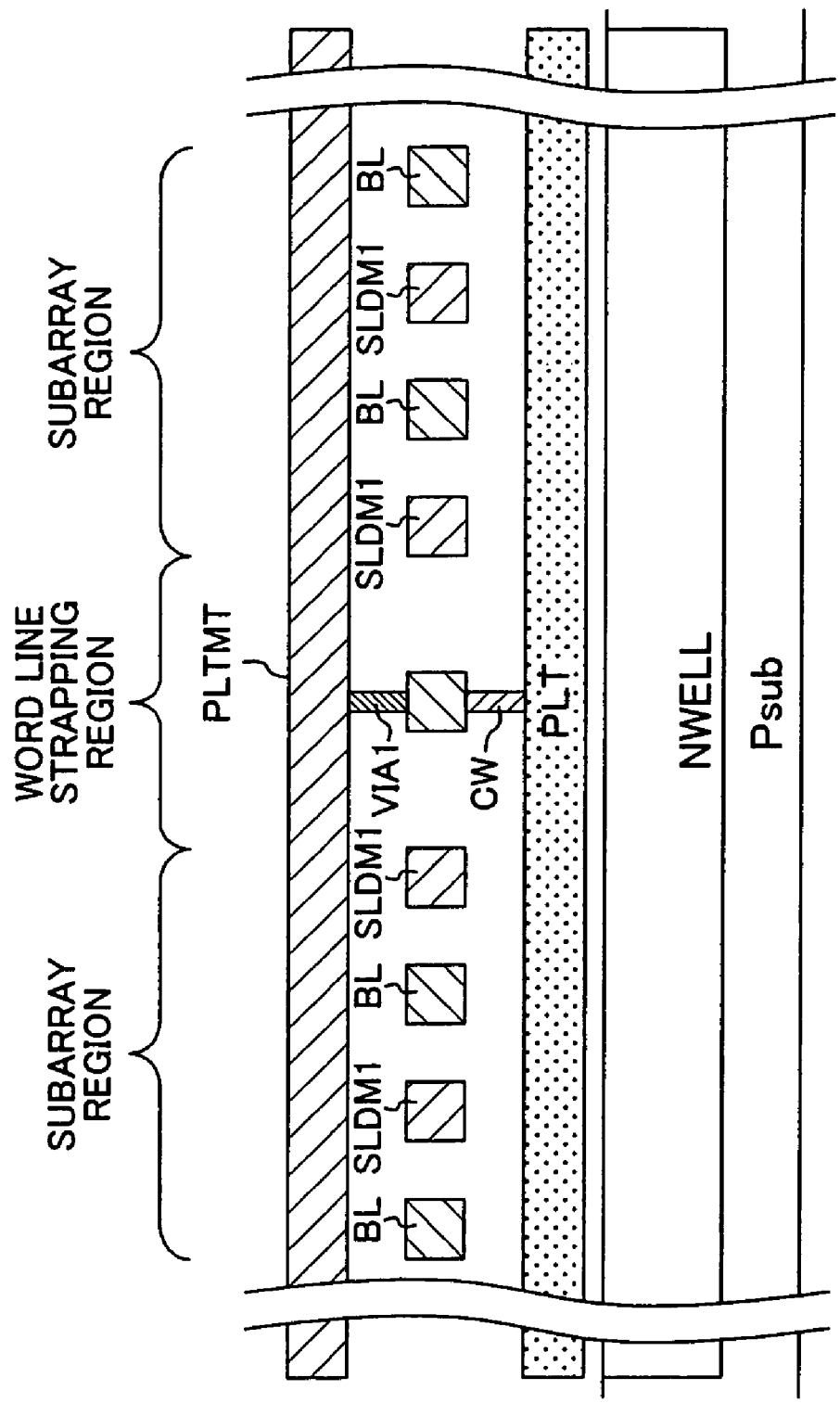
FIG. 5 is a cross-sectional view taken along the line V—V of FIG. 2.
Figure 6:
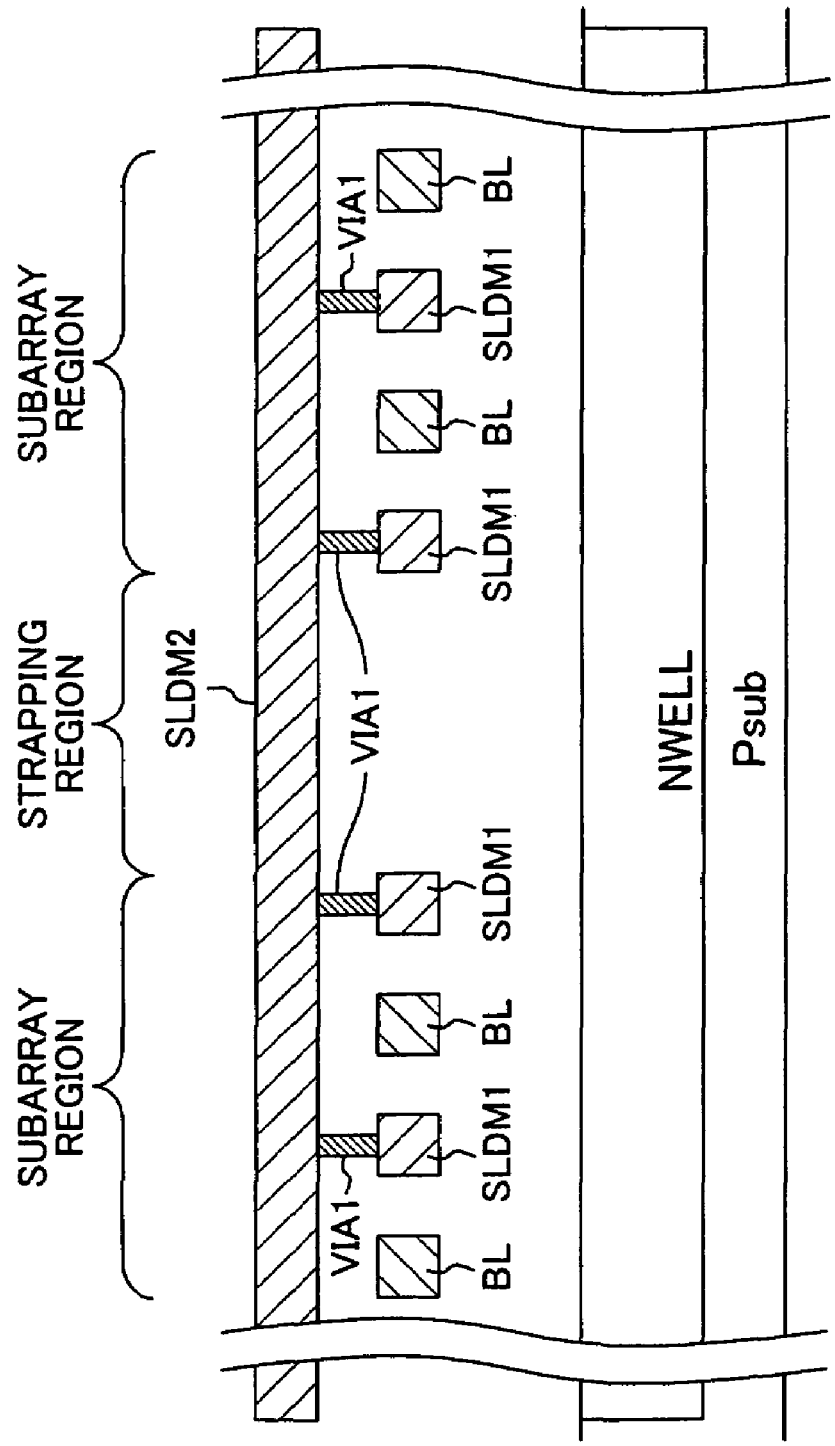
FIG. 6 is a cross-sectional view taken along the line VI—VI of FIG. 2.

FIG. 5 is a cross-sectional view taken along the line V—V of FIG. 2, which is in the common plate electrode PLT, and FIG. 6 is a cross-sectional view taken along the line VI—VI of FIG. 2, which is in the second wiring pattern SLDM2. As seem in FIG. 5, in sub-memory regions, a plurality of bit lines BL and the first wiring pattern SLDM1 are alternately formed in the first metal wiring layer. In the second metal wiring layer, the plate electrode strapping line PLTMT is formed, and in the word line strapping region JT, the strapping line PLTMT is connected to the common plate electrode PLT formed in the polysilicon layer via the contact VIA1 and the contact CW.

As seem in FIG. 6, in the sub-memory regions, a plurality of bit lines BL and the first wiring pattern SLDM1 are alternately formed in the first metal wiring layer. The second wiring pattern SLDM2 formed in the second metal wiring layer is connected to the first wiring pattern SLDM1 via the contract VIA1 at the intersectional point with the first wiring pattern SLDM1. It should be noted that the cross-sectional structure of transistors and capacitors in the memory cells are not depicted FIGS. 3 through 6.

As will be appreciated from the foregoing discussion and FIGS. 2, 3, and 6, the first wiring pattern SLDM1 and the second wiring pattern SLDM2 are arranged in a network-like manner and a fixed potential VDD is supplied from the second wiring pattern SLDM2 to the first wiring pattern SLDM1, and therefore, the fixed potential VDD can be supplied to the first wiring pattern SLDM1 with low resistance. Consequently, the shielding function of the first wiring pattern SLDM1, which is formed between adjacent bit lines BL, is exhibited in a more stable manner.

Moreover, as shown in FIGS. 2 and 3, the fixed potential VDD of the first wiring pattern SLDM1 is supplied also to the substrate NWELL and the substrate potential is made equal to the fixed potential VDD of the first wiring pattern SLDM1, and therefore, the substrate potential can be stabilized.

Further, in a memory cell as in the present embodiment in which the word line WL and the common plate electrode PLT are formed in a polysilicon layer by the same manufacturing step, the common plate electrode PLT is divided or segmentalized within the same memory array MATA by the word lines WL located to the left and right thereof, and therefore, each of the segmentalized common plate electrode PLT has a high resistance value. However, in the present embodiment, the resistance of the common plate electrode PLT is reduced since the plate electrode strapping line (fourth wiring pattern) PLTMT is formed in the upper layer of the common plate electrode PLT (the same wiring layer as that of the word line strapping line WLMT and the second wiring pattern SLDM2) and the plate electrode strapping line PLTMT is commonly connected to the common plate electrode PLT formed in the polysilicon layer by the contacts VIL1 and CW in each of the word line strapping region JT. Accordingly, interference noise from the common plate electrode PLT is suppressed when data are read out, and thereby data read operation can be stabilized.

In addition, as seen from FIG. 4, the configuration is such that the plate electrode strapping line PLTMT and the second wiring pattern SLDM2 are disposed to the left and right of the word line strapping line WLMT. Therefore, the interference noise between two word lines WL can be reduced, and the data read operation can be stabilized.

The present embodiment employs a planar type (parallel planar type) memory cell using a MOS capacitor, shown in FIG. 1B. The planar memory cell has a larger memory cell area and simpler structure compared to memory cells using a three-dimensional type capacitor such as a stack capacitor or a trench capacitor. For this reason, the bit line pitch and the word line pitch are less constrained, so it is unnecessary to add a special manufacturing step to a CMOS process. Consequently, especially when a planar memory cell is employed, the foregoing configuration is easy to attain, and manufacturing cost can be reduced in addition to achieving stability in operation.

It should be noted that, in the present embodiment, the word lines WL and the common plate electrodes PLT are formed in a polysilicon layer, but it is also possible to use other structures such as a layered structure of polysilicon and tungsten; primarily, it is only necessary that the word lines and the plate electrodes are formed in the same manufacturing step. In the present embodiment, the bit lines BL and the first wiring pattern SLDM1 are formed in the first metal wiring layer, but these may be formed with other wiring materials or in other wiring layers; primarily, it is only necessary that the bit lines BL and the first wiring pattern SLDM1 are formed in the same manufacturing step.

Figure 7:
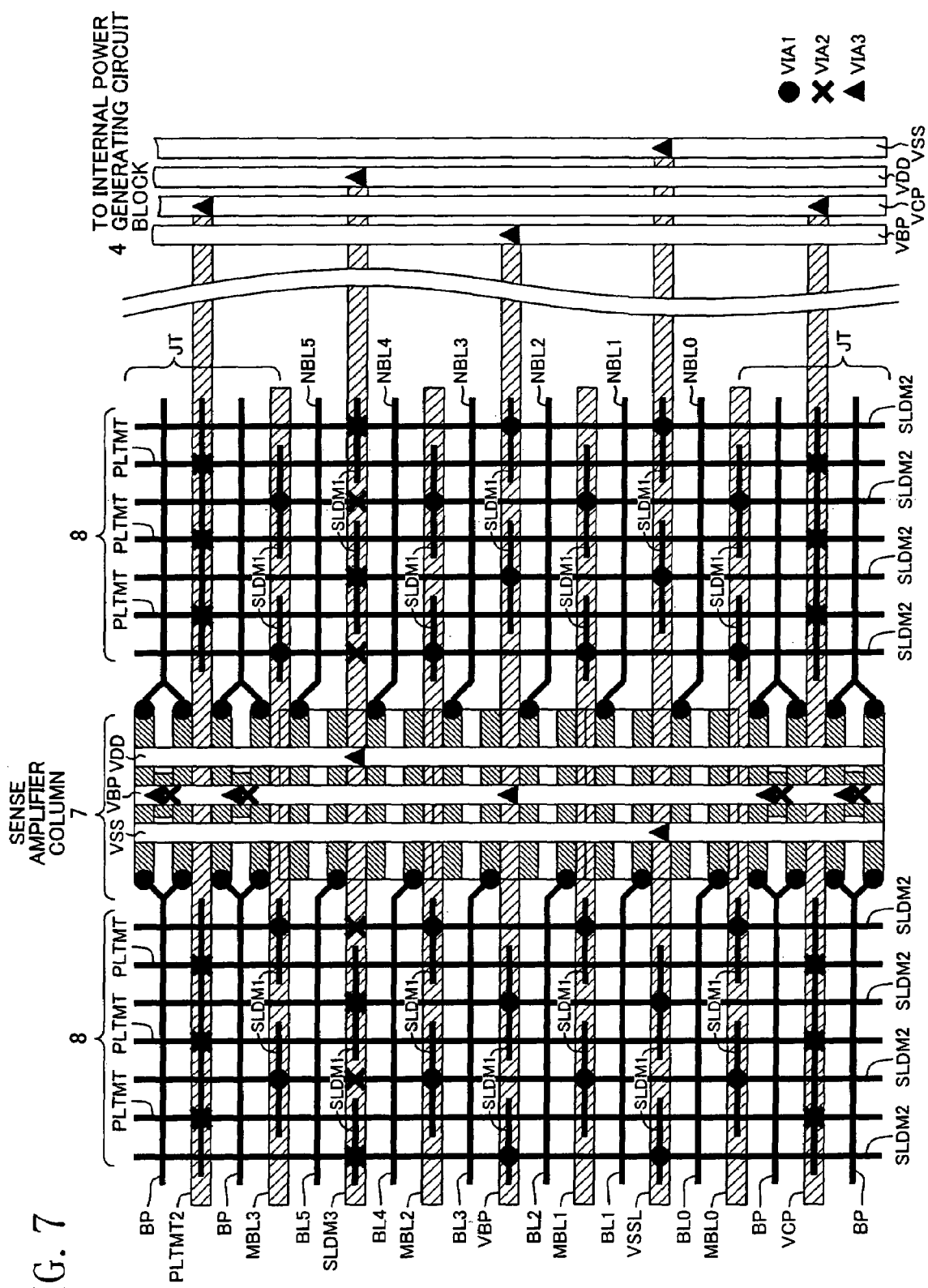
FIG. 7 shows the layout configuration of power lines in a sense amplifier column and subarrays located on the right and left thereof in the dynamic RAM.

FIG. 7 shows an example of the method of supplying power in the dynamic RAM according to the present embodiment, which illustrates the configuration in the metal wiring layer for power supply.

In the figure, BL0 to BL5 and NBL0 to NBL5 denote bit lines, all of which are formed in the first metal wiring layer, and the bit lines in the same rows (BL0, NBL0) through (BL5, NBL5) constitute complementary bit line pairs. MBL0 to MBL3 denote global bit lines extending in the same directions as the bit lines BL0 to BL5 and NBL0 to NBL5 and passing through each memory array 6, each of which is formed in a third metal wiring layer and is selectively connected to one of bit lines by a predetermined switching means (not shown in the figure) in the sense amplifier regions in each memory array 6.

SLDM1 denotes a first wiring pattern disposed between adjacent bit lines BL0 to BL5 and between adjacent bit lines NBL0 to NBL5, which are formed in the first metal wiring layer so as to be segmented at a predetermined length. The reason why the first wiring pattern SLDM1 is segmented will be discussed later (discussed with reference to FIG. 8). SLDM2 denotes a second wiring pattern formed so as to intersect the first wiring pattern SLDM1, which is formed by a plurality of lines at an equal pitch in the second metal wiring layer, and is connected to the first wiring pattern SLDM1 at each intersectional point with the first wiring pattern SLDM1 by contacts VIA1 (denoted by black circles in the figure). In addition, to the second wiring pattern SLDM2, a fixed potential VDD is supplied, as will be described later, and the second wiring pattern SLDM2 is connected to the substrate of the memory array 6 by the contacts VIA1 in the word line strapping region JT to stabilize the substrate potential.

SLDM3 denotes a third wiring pattern, which is formed in a metal wiring pattern that is in the third layer, extends parallel to the same direction as the global bit lines MBL0 to MBL3 (bit line direction) in the same wiring layer, and is connected to the second wiring pattern SLDM2 at each intersectional points with the second wiring pattern SLDM2 by contacts VIA2 (denoted by crosses in the figure). A line of the third wiring pattern SLDM3 is formed so as to be sandwiched by two predetermined global bit lines (MBL2 and MBL3 in the case of the figure), and is formed by a plurality of lines at equal pitches as a whole. It passes through the subarrays 8, 8 and the sense amplifier column 7 in the regions of the memory array 6 horizontally in FIG. 7, and reaches the layout region of power supply lines VBP, VCP, VDD, and VSS that are connected to an internal power generating circuit block 4 shown in FIG. 14. In the layout region and each sense amplifier column 7, the third wiring pattern SLDM3 is commonly connected to a power line VDD by contacts VIA3 (denoted by black triangles in the figure), so that it receives power supply from the power line VDD of the internal power generating circuit block 4 and commonly supplies the received fixed potential to sense amplifier circuits SA0 through SAn in the sense amplifier column 7, and to the first wiring pattern SLDM1 via the second wiring pattern SLDM2. It should be noted that the third wiring pattern SLDM3 may be commonly connected to a ground line VSS of the internal power generating circuit 4 and ground lines of the sense amplifier circuits SA0 through SAn so as to supply a ground potential (fixed potential) to the first wiring pattern SLDM1.

Thus, the supply of the fixed potential (power supply potential VDD) to the first wiring pattern SLDM1 is made through a three-layered structure having the second and the third wiring patterns SLDM2 and SLDM3, and in the first and the second wiring layers, these first and second wiring patterns SLDM1 and SLDM2 are formed of a multiplicity of lines that intersect one another between these wiring layers in a network form to have a multiple mesh structure. By supplying the fixed potential VDD with such a wiring structure, it is made possible to supply the fixed potential VDD to the first wiring pattern SLDM1 uniformly and at low resistance over the entire region of the memory array 6 including the sense amplifier column 7. As a result, interference noise between adjacent bit lines is effectively reduced during data read and data write operations in the memory array 6, and therefore, dependency on locations is reduced and stable operation can be obtained.

Next, FIG. 7 is discussed. In the figure, PLTMT denotes plate electrode strapping lines (fourth wiring pattern), which are for supplying a plate potential VCP to a plate electrode P of the memory cell shown in FIG. 1B, are formed in the second metal wiring layer on the subarray 8, and extend in the direction that crosses the global bit lines MBL0 to MBL3.

In FIG. 7, PLTMT2 denotes a plate potential VCP supplying line (fifth wiring pattern), which extends in the direction that crosses plate electrode strapping line PLTMT, that is, in the bit line direction, and is formed along the same direction as the global bit lines MBL0 to MBL3 and in the same wiring layer (the third metal wiring layer). The fifth wiring pattern PLTMT2 is connected to the plate electrode strapping line PLTMT in subarrays (memory mat) 8 arranged on opposing sides of the sense amplifier column 7 that is placed at the center by the contacts VIA2 (denoted by crosses in the figure), at each intersectional point in the word line strapping region JT.

The fifth wiring pattern PLTMT2 is disposed to be sandwiched by two global bit lines (MBL3 and a global bit line adjacent thereto, which is not shown in FIG. 7), and is formed by a plurality of lines at an equal pitch as a whole. At least one of the lines is provided in a unit constituted by one word line strapping region JT and one sub-memory 8 adjacent thereto. Accordingly, a plurality of lines of the fifth wiring pattern PLTMT2 are disposed to intersect a plurality of plate electrode strapping lines (fourth wiring pattern) PLTMT, and the supply of the plate potential VCP to the common plate electrodes PLT in both memory mats MATA and MATB is configured to be in a network-like form. The fifth wiring pattern PLTMT2 passes through the region of the subarrays 8 and the layout region of the power supply lines connected to the internal power generating circuit block 4, so that a plate potential VCP generated in the circuit block 4 is supplied to the power line (also denoted by VCP) via the plate electrode strapping lines PLTMT. These plate electrode strapping lines PLTMT supply the plate potential VCP to the common plate electrodes PLT in the word line strapping regions JT, as shown in FIG. 2.

Thus, in the present embodiment, a plurality of lines of the fifth wiring pattern PLTMT3 are connected to a plurality of plate electrode strapping lines (fourth wiring pattern) PLTMT in the memory mats 8 disposed to both sides of the sense amplifier column 7 placed at the center, and the common plate electrodes PLT of the memory mats 8 are connected to each other at low resistance. Therefore, the noise occurring in the common plate electrodes PLT during operation can be made uniform. Moreover, the common plate electrodes PLT of the memory mats 8 can be thus commonly connected to each other at low resistance, the noise occurring in the common plate electrode PLT of the operating side memory mat 8 is suppressed by the common plate electrode PLT of the other memory mat 8, which serves as a smoothing capacitance. Consequently, noise occurring in the common plate electrode PLT can be further reduced, and further stable operation can be achieved.

Further, in FIG. 7, BP denotes bit line-precharging potential-supplying lines and VSSL denotes ground potential-supplying lines. These supplying lines BP and VSSL both extend in the same direction as the global bit lines MBL0 to MBL3, and are formed by a plurality of lines in the same wiring layer (the third metal wiring layer). These supplying lines BP and VSSL are disposed to be sandwiched by two global bit lines and are arranged at a predetermined pitch in each subarray 8 so that at least one of the lines is included between two word line strapping regions JT, JT. The bit line-precharging potential-supplying lines BP and the ground potential-supplying lines VSSL pass through the sub-memory arrays 8 and the sense amplifier column 7, reaching the layout region of the power lines connected to the internal power generating circuit block 4, and they receive a bit line precharge potential VCP and a ground potential VSS.

Although the present embodiment describes a dynamic RAM having a word line strapping structure, it should be noted that the invention can be also applied to a dynamic RAM having a hierarchical word line structure which has sub-word lines and main word lines. Specifically, in the word line strapping structure, the region located between the subarrays 8, 8 is the word line strapping region JT, but in a dynamic RAM having the hierarchical word line structure, the region located between the subarrays (memory mats) 8, 8 is a sub-word line driving circuit region, though it is not shown in the drawings. In addition, in the dynamic RAM having a word line strapping structure described in the present embodiment, the row selecting signal lines for selectively activating the word lines are the word line strapping lines WLMT, but in the dynamic RAM having the hierarchical word line structure, the main word lines correspond to the row selecting signal lines.

Specific Configuration of Memory Cell

Figure 8:
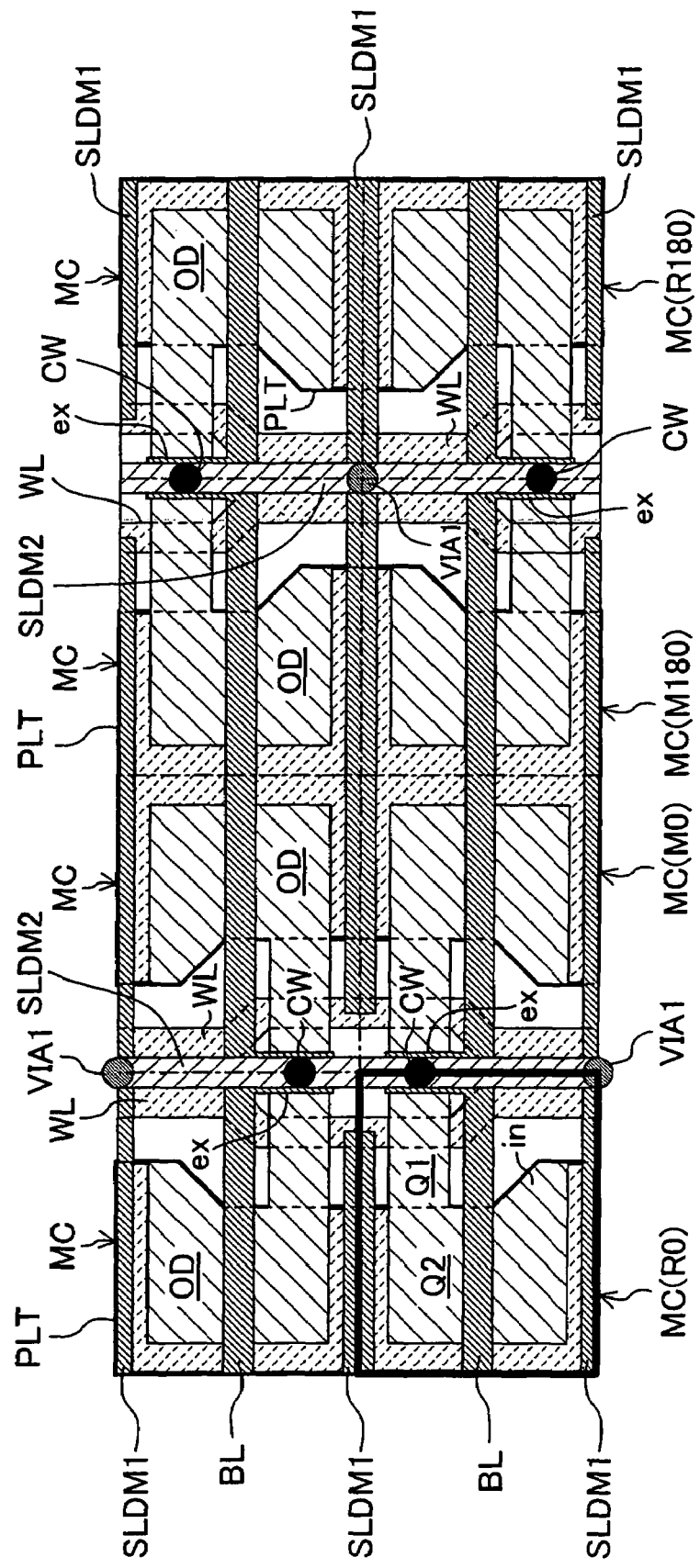
FIG. 8 shows the layout configuration of memory cells in the dynamic RAM.

FIG. 8 shows a specific layout configuration of memory cells MC comprised in a dynamic RAM according to the present embodiment. In the figure, WL denotes word lines, BL denotes bit lines, PLT denotes common plate electrodes, SLDM1 denotes a first wiring pattern, which is disposed between adjacent bit lines BL, BL and is formed in the same first metal wiring layer in which the bit lines BL are formed. SLDM2 denotes a second wiring pattern, which is formed in the second metal wiring layer. MC denotes memory cells comprising, as shown in FIG. 1B, a transfer gate Q1 composed of one MOS transistor, and a MOS capacitor Q2 composed of one MOS transistor. As shown in FIG. 8, when the memory cells MC are arranged in an array form, 8 memory cells constitute one unit in which 4 memory cells are arranged along the bit line direction and 2 memory cells are arranged along the word line direction.

In FIG. 8, OD denotes an active region in the memory cell MC, and the overlapped portion of the active region OD and the word line WL is formed into the transfer gate Q1. Likewise, the overlapped portion of the active region OD and the common plate electrode PLT is formed into the MOS capacitor Q2. VIAL denotes contacts for connecting the first wiring pattern SLDM1 with the second wiring pattern SLDM2. As can be seen from FIG. 8, the common plate electrode PLT is commonized between a plurality of memory cells MC including the memory cells MC that are connected to a common word line WL and the memory cells MC adjacent thereto.

The present embodiment employs the following configuration in order to increase the area of the MOS capacitor Q2 as much as possible within the limited area. In the following description, a memory cell MC that is emphasized by a bold lined square in the figure, which is in the bottom left corner of the figure, is taken as an example. This memory cell MC has an extended portion in in which the bottom half region of the common plate electrode PLT is expanded in the bit line direction toward the right of the figure, to form a so-called boot-type (stepped shape) MOS capacitor Q2. In conformity with this expanded shape of the common plate electrode PLT, the word line WL that is arranged adjacent thereto is also bent to the right of the figure at the expanded portion. In conformity with the expanded shape of the common plate electrode PLT, the position of the transfer gate Q1 is not set directly below the bit line BL, but set at a position shifted upward of the figure and toward the word line. In addition, the bit line BL connected to this transfer gate Q1 is formed with a protruding portion ex extending upward in the figure and toward the transfer gate Q1, and a contact CW is formed near the fore-end of the protruding portion ex so that the protruding portion ex is connected to the transfer gate Q1 by the contact CW. Further, in order not to cause a short circuit between the protruding portion ex of the bit line BL and the first wiring pattern SLDM1, the first wiring pattern SLDM1 is segmented at the connecting portion between the protruding portion ex of the bit line BL and the transfer gate Q1, that is, near the contact CW.

Referring to the figure, a memory cell MC (M0) that is located on the right of the memory cell MC (R0) that is in the bottom left of the figure has a laterally inverted configuration of the memory cell MC (R0); a memory cell MC (M180) that is located on the right of the memory cell MC (M0) has a vertically inverted configuration of the memory cell MC (R0); and a memory cell MC (R180) that is located on the right of the memory cell MC (M180) has a vertically and laterally inverted configuration of the memory cell MC (R0). These 4 memory cells MC (R0), MC (M0), MC (M180), and MC (R180) that are arranged in the same row along the direction of bit lines BL are a single sub-unit, and in the direction of word lines WL, another sub-unit is arranged that is composed of 4 memory cells MC having a vertically inverted configuration of the memory cells of the foregoing sub-unit.

In the present embodiment, the above-described arrangement of the memory cells MC makes it possible to configure a wide MOS capacitor Q2 with a small area and to effectively configure the first wiring pattern SLDM1 that has a shielding effect against bit line interference noise. Thus, a dynamic RAM can be obtained in which both reduction in the chip size and operational stability are achieved.

Embodiment 2

A semiconductor memory device according to Embodiment 2 of the invention is described below. The present embodiment relates to an improvement of the layout configuration of sense amplifier circuits and bit lines in a dynamic RAM.

Figure 9:
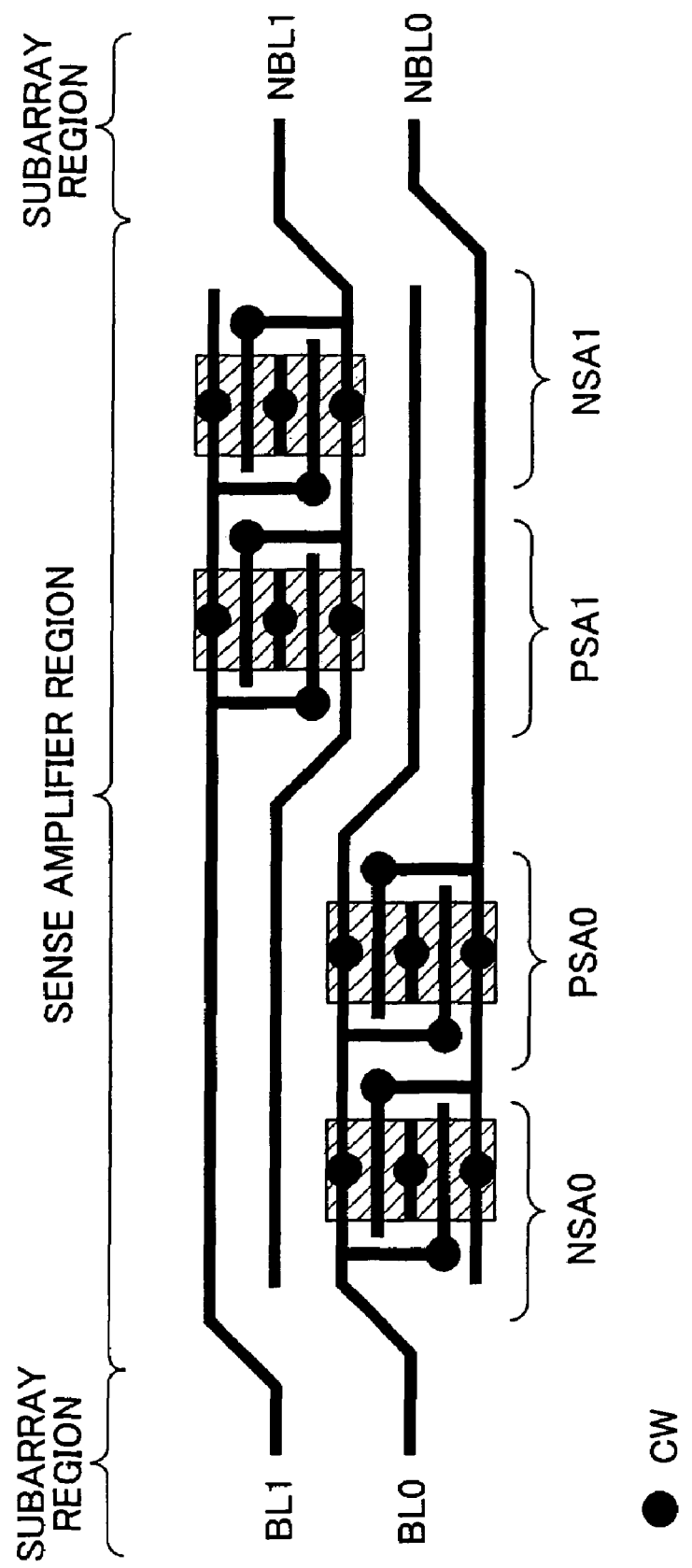
FIG. 9 shows the layout configuration of a sense amplifier circuit in the dynamic RAM.

Before detailing the present embodiment, the layout configuration shown in FIG. 9 is described. In the figure, BL0, BL1, NBL0, and NBL1 denote respective bit lines; the bit lines BL0 and NBL0 constitute a complementary bit line pair, and the bit lines BL1 and NBL1 constitute another complementary bit line pair. The bit lines BL0, BL1, NBL0, and NBL1 are formed in the same metal wiring layer (a first metal wiring layer), both in the regions of the subarrays 8 and in the region of the sense amplifier.

NSA0, NSA1, PSA0, and PSA1 denote pair transistors that form respective pairs in the sense amplifier circuit (CMOS latch circuit). In the bit line pairs (BL0, NBL0) and (BL1, NBL1), ones of the bit lines BL0 and BL1 and the other ones of the bit lines NBL0 and NBL1 extend in opposite directions with respect to the pair transistors NSA0, NSA1, PSA0, and PSA1 to constitute a single intersection type (open bit line type) memory array.

FIG. 9 shows the following configuration. An N-channel pair transistor NSA0 and a P-channel pair transistor PSA0, which constitute a sense amplifier circuit for one of the bit line pair (BL0, NBL0), are arranged adjacent to each other, and an N-channel pair transistor NSA1 and a P-channel pair transistor PSA1, which constitute a sense amplifier circuit for one of the bit line pair (BL1, NBL1), are likewise arranged adjacent to each other, so that the wiring lengths are approximately equal between the bit lines BL0 and NBL0 and between the bit lines BL1 and NBL1, which respectively constitute complementary bit lines.

Thus, as can be seen from FIG. 9, two sets of sense amplifier circuits for two sets of complementary bit line pairs are disposed separately in two columns, and practically, one sense amplifier circuit can be provided for each bit line pitch. Consequently, the layout area of the sense amplifier circuit can be reduced. In addition, the balance of capacitive load between two bit lines constituting a complementary bit line pair can be maintained uniform, and therefore, more stable operation can be achieved.

Next, a semiconductor memory device according to the present embodiment is described with reference to FIG. 10.

According to the layout configuration of the sense amplifier circuit shown in the figure, in the subarray (memory mat) region, the bit lines BL0, BL1, NBL0, and NBL1 are formed in the first metal wiring layer, whereas in the portion extending to the sense amplifier region, they are formed in a second metal wiring layer, which is different from the first layer. In addition, in the subarray regions, a complementary bit line pair is formed by an odd-numbered bit line (the 1st one in the figure) NBL0 in the subarray region that is on the right of FIG. 10 and an even-numbered bit line (the 0th one in the figure) BL0 in the subarray region that is on the left of FIG. 10, and another complementary bit line pair is formed by an even-numbered bit line (the 0th one in the figure) NBL1 in the subarray region that is on the right of FIG. 10 and an odd-numbered bit line (the 1st one in the figure) BL1 in the subarray region that is on the left of FIG. 10. In these complementary bit line pairs, the two bit lines (BL0, NBL0) and (BL1, NBL1) that form pairs have substantially equal wiring lengths and wiring widths.

In addition, in the sense amplifier region, the N-channel pair transistor NSA0 and the P-channel pair transistor PSA0 that constitute a sense amplifier circuit for a set of the bit line pair (BL0, NBL0) and the N-channel pair transistor NSA1 and the P-channel pair transistor PSA1 that constitute a sense amplifier circuit for another set of the bit line pair (BL1, NBL1) are arrayed along the bit line direction at the same pitch of the two sets of complementary bit line pairs. Further, in the two sets of sense amplifier circuits, the N-channel pair transistors NSA0 and NSA1 are disposed adjacent to each other collectively at one location, and the P-channel pair transistors PSA0 and PSA1 are likewise disposed adjacent to each other collectively at one location. It should be noted that crosses x in FIG. 10 denote contacts for connecting the first layer and the second layer.

In the present embodiment, the wiring lengths and the wiring intervals of the two bit lines (BL0, NBL0) or (BL1, NBL1), each constituting a complementary bit line pair, can be made uniform. Therefore, balance of capacitive loads can be maintained uniform. At the same time, because the bit lines BL0, NBL0, BL1, and NBL1 are parallel to each other in the sense amplifier region and the wiring intervals are uniform, the layout design of the sense amplifier circuit is facilitated.

Moreover, since four pair transistors NSA0, PSA0, NSA1, and PSA1 that constitute two sets of CMOS latches can be arrayed along the bit line direction in a linear fashion, the pitch of the sense amplifier circuits arranged in an array form can be made four times the wiring pitch of the second layer and the layout dimension with respect to the word line direction can be reduced.

Furthermore, in the two sets of CMOS latch circuits, the N-channel pair transistors NSA0 and NSA1 are disposed together collectively in one region and the P-channel pair transistors PSA0 and PSA1 are disposed together collectively in one region. Therefore, the region for separating the N-channel pair transistors and the P-channel pair transistors can be reduced and the layout dimension can be reduced also with respect to the bit line direction.

Figure 10:
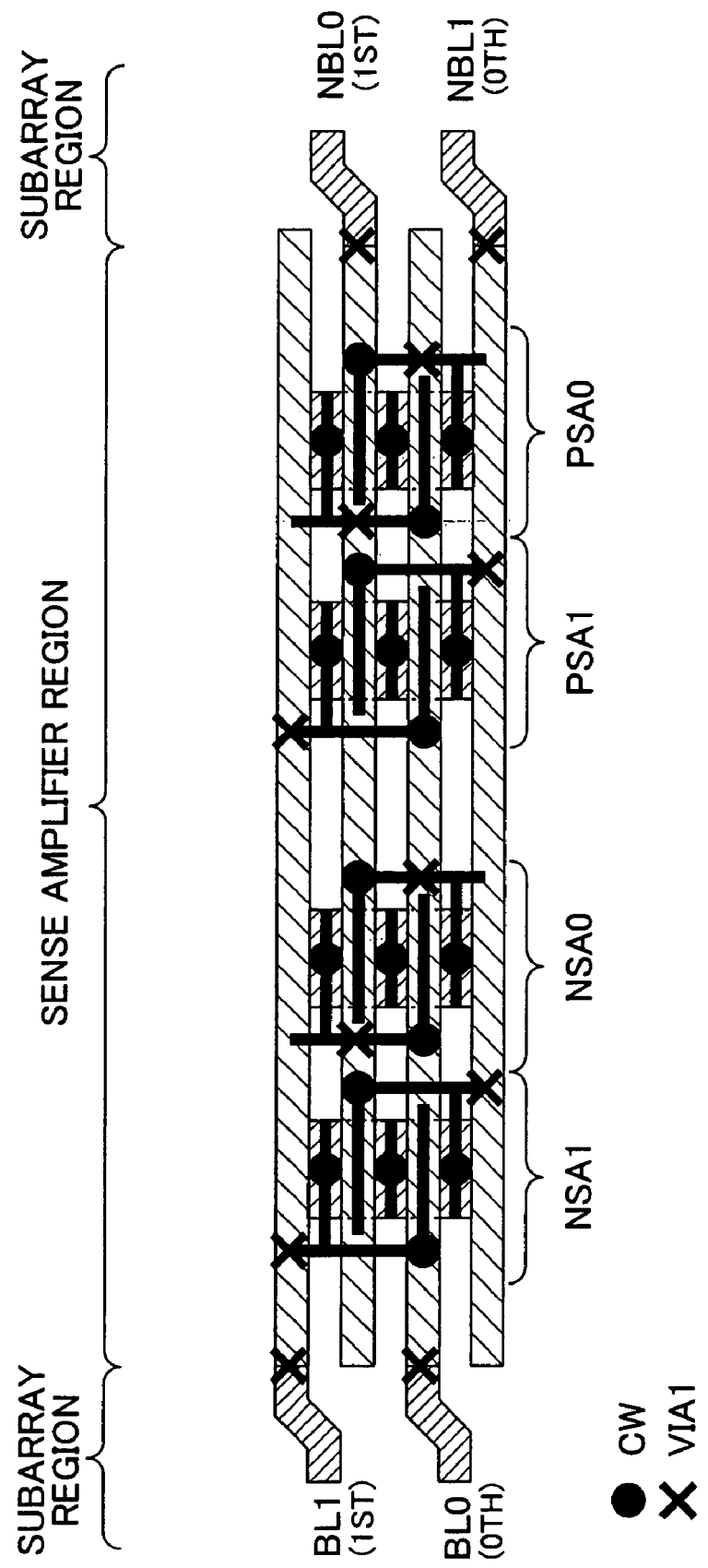
FIG. 10 shows a layout configuration of a sense amplifier circuit in a dynamic RAM according to Embodiment 2 of the present invention.
Figure 11:
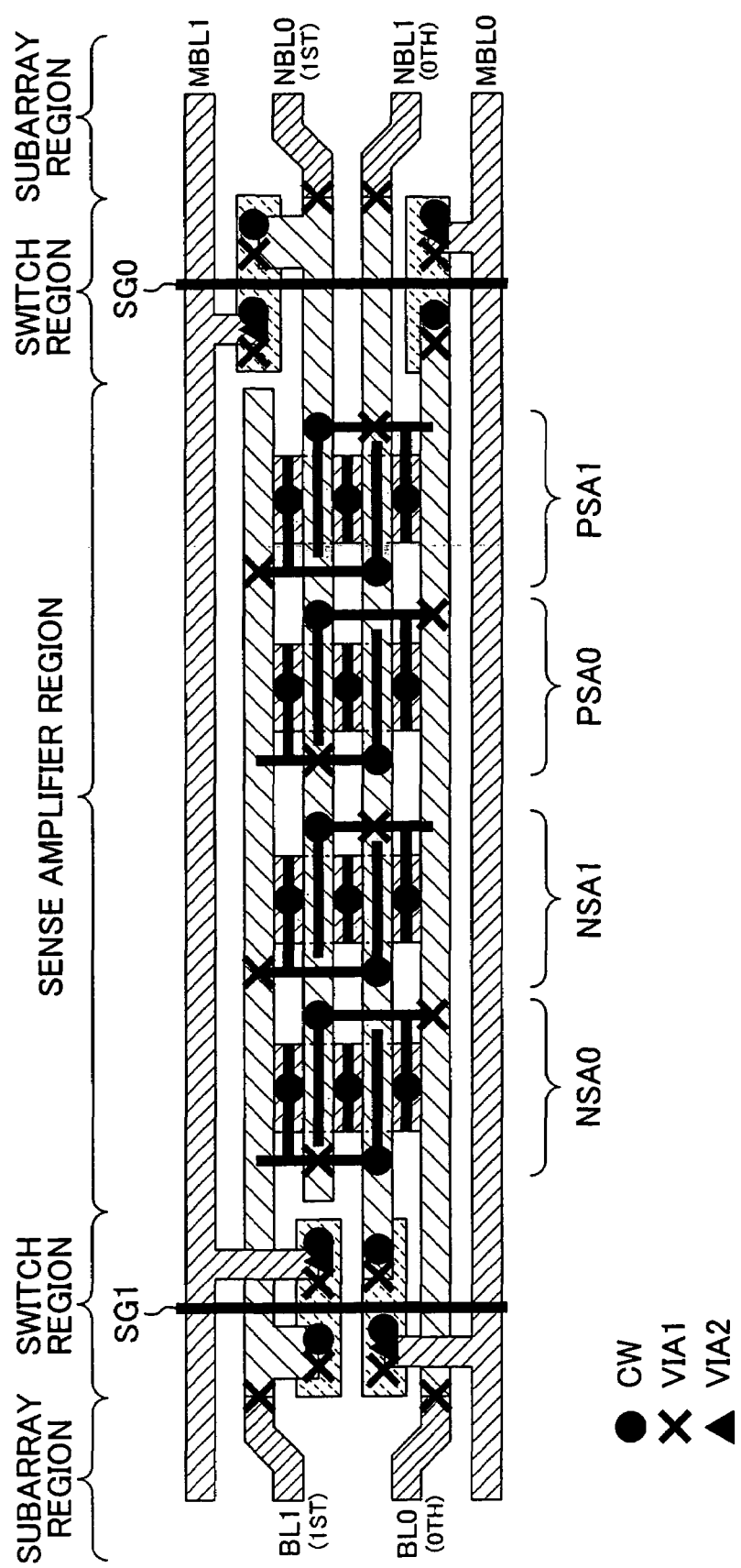
FIG. 11 shows another layout configuration of a sense amplifier circuit in the dynamic RAM.

FIG. 11 shows a configuration in which global bit lines are additionally provided in the layout configuration of the sense amplifier circuit shown in FIG. 10.

In the figure, MBL0 and MBL1 denote global bit lines, which pass through the subarrays 8 and are formed in the third wiring layer. In the sense amplifier region, the bit lines BL0, NBL0, BL1, and NBL1 are formed in the second wiring layer, whereas in the subarray regions, they are formed in the first wiring layer. A complementary bit line pair is formed by an even-numbered bit line (the 0th one in the figure) BL0 in the subarray region that is on the left of FIG. 11 and an odd-numbered bit line (the 1st one in the figure) NBL0 in the subarray region that is on the right of FIG. 11, and another complementary bit line pair is formed by an odd-numbered bit line (the 1st one in the figure) BL1 in the subarray region that is on the left of FIG. 11 and an even-numbered bit line (the 0th one in the figure) NBL1 in the subarray region that is on the right of FIG. 11.

In FIG. 11, SG0 denotes a switch circuit for connecting the bit line pair (BL0, NBL0) to the global bit lines MBL0 and MBL1, and SG1 denotes a switch circuit for connecting the bit line pair (BL1, NBL1) to the global bit lines MBL0 and MBL1. The switch circuit SG0 is disposed to the right end sides of the bit lines BL0 and BL1, which extend across the sense amplifier region toward the left of the figure, whereas the switch circuit SG1 is disposed to the left end sides of the bit lines NBL0 and NBL1, which extend across the sense amplifier region toward the right of the figure. By these two switch circuits SG0 and SG1, one of two sets of complementary bit line pairs is selectively connected with the global bit lines MBL0 and MBL1.

In general, in order to connect bit lines to the global bit lines MBL0 and MBL1, the switch circuits SG0 and SG1 require that a second wiring layer with a different node from the bit lines be provided on the global bit line side of the switch circuits. However, in the sense amplifier region, the second wiring layer is used up for the wiring layer of the bit lines BL0, BL1, NBL0, and NBL1, and therefore, these switch circuits SG0 and SG1 cannot be placed in the sense amplifier region. When a pair of complementary bit lines are adjacent to each other in the sense amplifier region, the switch circuit needs to be placed separately on opposing sides of the sense amplifier region in order to place the switch circuit for the complementary bit line pair. This degrades layout efficiency. According to the present embodiment, however, the switch circuit SG0 is placed on the right ends of the bit lines BL0 and BL1 collectively at one location, and likewise, the switch circuit SG1 is placed on the left ends of the other bit lines NBL0 and NBL1 collectively at one location. Since the switch circuits SG0 and SG1 for the respective complementary bit line pairs (BL0, NBL0) and (BL1, NBL1) are thus laid out collectively in the same regions respectively, reduction in the layout area is possible.

Embodiment 3

Next, another example of the present invention is described with referent to FIG. 13. The present embodiment pertains to an improvement of a latch circuit in the sense amplifier circuit.

First, a conventional configuration is described. FIG. 12 is a schematic view of a conventional layout configuration of pair transistors that constitute a latch circuit in a sense amplifier circuit. In the figure, OD denotes an active region, Q1 and Q2 denote pair transistors that form a pair in the latch circuit, BL and NBL denote a pair of complementary bit lines, and S denotes a common source of the pair transistors Q1 and Q2. One of the bit lines BL is connected to the gate of one of the transistors Q1 and the drain of the other transistor Q2, and the other bit line NBL is connected to the gate of the other transistor Q2 and the drain of the one of the transistors Q1. The gate electrodes G1 and G2 of the respective pair transistors Q1 and Q2 are disposed parallel to each other in the same active region OD and are disposed symmetrically with respect to the common source electrode S. Here, on the active region OD, the gate length L1 of the gate electrodes G1 and G2 of the pair transistors Q1 and Q2 are the same length L1.

With recent microfabrication processes, if the gate lengths and the gate widths of the transistors Q1 and Q2 are set small in the foregoing conventional configuration, the relative variation in threshold voltages of the pair transistors Q1 and Q2 becomes considerably large. If the relative variation in threshold voltages of the pair transistors Q1 and Q2 becomes large, the operation margin of the sense amplifier circuit becomes small as the sense amplifier circuit amplifies a very small bit line potential of around several ten millivolts, and data read errors may occur.

FIG. 13 shows one embodiment of the layout configuration of a sense amplifier circuit for resolving the above-described problem. As can be seen from the figure, the components are identical to those in FIG. 12, which illustrates a conventional example. However, in the gate electrodes G1 and G2 extending parallel to each other in the active region OD of the transistors Q1 and Q2, the gate length L2 of the portions near the boundary (opposing end portions of the active region OD) between the active region OD of the pair transistors Q1 and Q2 and the separating regions is set longer than the gate length L1 of the central portions (L2>L1). In the present embodiment, the gate length L2 is set according to the following expression: L2>2·L1. In addition, in conformity with this configuration, the transistors Q1 and Q2 are configured to be symmetrical with respect to the word line direction as well as with respect to the bit line direction, where the common source S is placed at the center.

According to the present embodiment, the following effects are achieved. Near the boundary between the active region OD and the separating region, relative variation of threshold voltage occurs due to processing variation, variation in concentrations of implanted ions, or the like. However, the gate length L2 in the vicinity of the boundary between the active region OD and the separating region is large, the channel region around this region does not easily function as a transistor in the vicinity of the threshold voltage. As a result, the relative variation of the pair transistors Q1 and Q2 is reduced, and therefore, operational stability of the sense amplifier circuit, which amplifies very small potential differences, is remarkably improved.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A sense amplifier circuit for amplifying a voltage difference between a pair of complementary bit lines of a semiconductor memory device, the sense amplifier comprising:

a first transistor, formed in an active region, having a first gate disposed straight along a bit line direction, a first drain coupled to a first bit line, and a common source; and a second transistor, formed in the active region, having a second gate disposed in parallel to the first gate, a second drain coupled to a second bit line, and the common source shared with the first transistor, wherein the first gate is coupled to the second drain and the second gate is coupled to the first drain to form a latch circuit, and wherein each of the first and the second gates have a first portion, at a first edge of the active region, having a first gate length along a perpendicular direction that is perpendicular to the bit line direction, a second portion, at a second edge opposing the first edge, having the first gate length along the perpendicular direction, and a third portion, between the first and second portions, having a second gate length along the perpendicular direction, the first gate length being longer than the second gate length.

2. A sense amplifier circuit according to claim 1, wherein the first gate length is longer than twice the second gate length.

* * * * *